United States Patent [19]

Yoneda

[11] Patent Number: 5,530,665
[45] Date of Patent: Jun. 25, 1996

[54] METHOD OF USING ASSOCIATIVE MEMORIES AND AN ASSOCIATIVE MEMORY

[75] Inventor: Masato Yoneda, Tokyo, Japan

[73] Assignee: Kawasaki Steel Corporation, Hyogo-ken, Japan

[21] Appl. No.: 468,669

[22] Filed: Jun. 6, 1995

Related U.S. Application Data

[62] Division of Ser. No. 277,769, Jul. 20, 1994, Pat. No. 5,483,480.

[30] Foreign Application Priority Data

| Jul. 22, 1993 | [JP] | Japan | 5-181447 |
| Oct. 4, 1993 | [JP] | Japan | 5-248121 |
| Oct. 25, 1993 | [JP] | Japan | 5-266482 |
| Mar. 24, 1994 | [JP] | Japan | 6-54140 |

[51] Int. Cl.⁶ .................................................. G11C 15/00
[52] U.S. Cl. .................................................. 365/49
[58] Field of Search ............... 365/49, 189.07, 365/189.12, 78

[56] References Cited

U.S. PATENT DOCUMENTS

| 3,353,159 | 11/1967 | Lee | 365/49 |
| 3,742,460 | 6/1973 | Englund | 365/49 |
| 4,845,668 | 7/1989 | Sano et al. | 365/49 |
| 5,034,919 | 7/1991 | Sasai et al. | 365/49 |
| 5,036,486 | 7/1991 | Noguchi et al. | 365/189.07 |
| 5,101,376 | 3/1992 | Noguchi et al. | 365/189.07 |
| 5,226,009 | 7/1993 | Arimoto | 365/189.04 |

FOREIGN PATENT DOCUMENTS

| 0400820 | 12/1990 | European Pat. Off. . |
| 53-40237 | 4/1978 | Japan . |
| 61-283096 | 12/1986 | Japan . |

OTHER PUBLICATIONS

Patent Abstracts of Japan, vol. 11, No. 147 (P-575), May 14, 1987.

Primary Examiner—Tan T. Nguyen
Attorney, Agent, or Firm—Oliff & Berridge

[57] ABSTRACT

A pair of attribute and data is stored in each word memory of associative memories. A retrieval is performed using reference data applied from an exterior and the pair of attribute and data stored in each word memory of associative memories. Upon receipt of a match of the attribute, a signal representing a match or mismatch of both attribute and data except the attribute is supplied to a data line. At the time of subsequent retrieval, upon receipt of a match of the attribute, data appearing on the data line is taken in.

7 Claims, 17 Drawing Sheets

|  k  | m − k |
|-----|-------|
| ATTRIBUTE 0 | A |
| ATTRIBUTE 1 | A |
| ATTRIBUTE 2 | B |
| ATTRIBUTE 3 | C |

| | |
|-----|-------|
| ATTRIBUTE 0 | C |
| ATTRIBUTE 1 | A |
| ATTRIBUTE 2 | D |
| ATTRIBUTE 3 | E |

⋮

| | |
|-----|-------|
| ATTRIBUTE 0 | B |
| ATTRIBUTE 1 | C |
| ATTRIBUTE 2 | A |
| ATTRIBUTE 3 | A |

Fig. 1

METHOD OF USING ASSOCIATIVE MEMORIES AND AN ASSOCIATIVE MEMORY

This is a division of application Ser. No. 08/277,769, filed Jul. 20, 1994, now U.S. Pat. No. 5,483,480.

BACKGROUND OF THE INVENTION

1. Field of the Invention

The present invention relates to an associative memory having a plurality of word memories each for storing storage data in units of words, in which a retrieval of the word memories storing predetermined storage data is performed using applied reference data.

2. Description of the Related Art

Hitherto, there has been proposed an associative memory or a content addressable memory provided with the retrieval function as mentioned above.

FIG. 14 is a circuit block diagram of the conventional associative memory by way of example.

Referring to FIG. 14, an associative memory 10 is provided with a number of word memories 11_1, 11_2, ..., 11_n each consisting of a m-bit of memory cell, arranged in a transverse direction of the figure, a word being expressed with "m" bits. Further, the associative memory 10 comprises a reference data register 12 which is adapted to latch a word of reference data when it is applied thereto, and a mask data register 13 arranged to store mask data to mask the reference data for each bit. A bit pattern of the non-masked data, which is the whole excepting one masked on the basis of the mask data stored in the mask data register 13 or a specified part, among the reference data latched in the reference data register 12 is compared with a bit pattern of the portion corresponding to the bit pattern of the latched reference data with respect to data stored in each of the word memories 11_1, 11_2, ..., 11_n. As a result of the comparison, if there are found any of the word memories 11_1, 11_2, ..., 11_n of which the bit pattern is coincident with that of the reference data, a match signal expressed as a logic "1" will appear on the associated ones of match lines 14_1, 14_2, ..., 14_n which are provided in conjunction with the word memories 11_1, 11_2, ..., 11_n, respectively. On the other hand, a mismatch signal expressed as a logic "0" will appear on the remaining ones of the match lines 14_1, 14_2, ..., 14_n.

The signals supplied to the match lines 14_1, 14_2, ..., 14_n are stored in match flag registers 15_1, 15_2, ..., 15_n, respectively. Now, assuming that the signals "0", "1", "1", "0", ..., "0", "0" appear on the match flag registers 15_1, 15_2, ..., 15_n, respectively, these signals are applied to an address encoder 16. The address encoder 16 is so arranged to output an address signal corresponding to the highest priority match flag register given with a highest priority among the match flag registers (here, only two match flag registers 15_2 and 15_3) which store the signals given by a logic "1". Supposing that the priority is higher as number of a suffix of the reference numeral becomes younger, in this case, the memory address associated with the match flag register 15_2 is outputted. Thus, an address encoder 16 outputs an address signal AD corresponding to the highest priority match flag registers 15_2, which address signal AD may be passed to an decoder 17, if necessary. The decoder 17 decodes the received address signal AD and outputs an access signal to the associated one (here a word line 18_2) of word lines 18_1, 18_2, ..., 18_n which are provided in conjunction with the word memories 11_1, 11_2, ..., 11_n, respectively. Thus, data stored in the word memory 11_2 associated with the word line 18_2 on which the access signal appears is read out to an output register 19.

Next, change of the signal "1" stored in the match flag register 15_2 to "0" makes it possible now to derive an address of the word memory 11_3 associated with the match flag register 15_3.

FIG. 15 is a functional block diagram of the conventional associative memory.

Applied to the associative memory are function data FUN_DATA and reference data REF_DATA. The function data FUN_DATA serves to define the function of the associative memory. For example, when the function data FUN_DATA takes binary number "01", it implies that the reference data REF_DATA, which is simultaneously applied, is a mask data, and thus such data is stored in a mask data register. On the other hand, when the function data FUN_DATA takes binary number "10", a retrieval is performed using the simultaneously applied reference data REF_DATA. The entered reference data REF_DATA is masked on the basis of mask data stored in the mask data register, and then supplied via a data line drive circuit to the respective word memories. When data stored in any of the word memories is coincident with the entered data, a match signal expressed by a logic "1" is stored in the associated match flag register.

As described above, according to the associative memory 10, the contents or data stored in a number of word memories 11_1, 11_2, ..., 11_n are retrieved using the reference data in its entirety or a part specified, so that an address of the word memory involved in the matched data is generated, and in accordance with the necessity the whole data stored in the word memory can be read out.

In the retrieval of data using the associative memory as mentioned above, in a case where data to be retrieved is formed in a group structure, specifically, in a case where a plurality of data constituting a group are each provided with the associated attribute, the associative memory as mentioned above encounters several problems to be solved.

The first one of those problems is involved in the point as to how to retrieve a desired data from among a number of data formed in a group structure. The first problem will be explained referring to the drawings hereinafter.

FIG. 16 is an illustration showing arrays of data each being provided with an attribute, which are stored in the associative memory.

It is assumed that a number of word memories, which constitute the associative memory, are segmented into groups each consisting of four pieces of word memory as a set. The first word memory of each set stores data to which "attribute 0" such as, for example, "name", is appended, the second word memory of each set stores stores data to which "attribute 1" such as, for example, "the day of one's birth", is appended, and hereafter similarly, the third word memory and the fourth word memory store data to which "attribute 2" and "attribute 3" are appended, respectively. Here, the data stored in the word memories are denoted by the letters of the English alphabet, such as A, B, .... Incidentally, a set of data group, to each data of which the associated attribute is appended as mentioned above, is referred to as a "data set", hereinafter.

It happens, as shown in FIG. 16, that there are stored data involved in the same bit pattern, but different in the attribute, as being provided in such a way that data related to the attribute 0 depicted at the highest stage of FIG. 16 is of "A", and data related to the attribute 1 depicted at the subsequent stage is also of "A".

In this situation, when it is desired to retrieve only data "A" (for example, name "A") belonging to the attribute 0, if data "A" is inputted in the form of reference data, the retrieval is made for not only data "A" belonging to the attribute 0 but also data "A" belonging to other attributes 1, 2 and 3. This needs such an additional retrieval operation that after the preceding retrieval operation the data belonging to the attribute 0 is again discriminated from among the data retrieved in the preceding retrieval operation. This operation is extremely troublesome, and it takes a lot of time for the discrimination.

The second problem, which will arise when data formed in a group structure or data set is retrieved, is involved in the point as to how to enhance a flexibility of the retrieval.

While the retrieval of individual data, for example, data "A" to which the 'attribute 0' is appended, data "B" to which the 'attribute 2' is appended, etc., can be implemented in some way, it becomes a problem how to retrieve the data set including, for example, both the data "A" to which the 'attribute 0' is appended and the data "B" to which the 'attribute 2' is appended.

In this case, as stated above, it is assumed that the retrieval of individual data, such as data "A" to which the 'attribute 0' is appended, data "B" to which the 'attribute 2' is appended, etc., can be implemented. Consequently, the retrieval is carried out, usually, in such a manner that a number of data sets, each including data "A" to which the 'attribute 0' is appended, are retrieved, and in addition a number of data sets, each including data "B" to which the 'attribute 2' is appended, are retrieved. According to such a scheme, there is need to discriminate again the data sets which satisfy both the data "A" to which the 'attribute 0' is appended and the data "B" to which the 'attribute 2' is appended. Hence, similar to the first problem as mentioned above, this operation is extremely troublesome, and it takes a lot of time for the discrimination.

Further, in the prior arts concerning the associative memory, there is known a technology as to expansion of the data width as an object of a match retrieval into two or more words, in a case where usual data are treated, but not in a case where data formed in a group structure are treated. Such a technology will be explained hereinafter.

FIG. 17 is a block diagram of an associative memory, by way of example, provided with a data expansion function. In FIG. 17, the same parts are denoted by the same reference numbers as those of FIG. 14, and the redundant description will be omitted.

Match lines 14_1, 14_2, . . . , which are extended from the word memories 11_1, 11_2, . . . , respectively, are connected to ones of two input terminals of AND gates 20_1, 20_2, . . . , respectively. Connected to the other ones of the two input terminals of the AND gates 20_2, 20_3, . . . are output terminals of OR gates 21_2, 21_3, . . . , respectively. Ones of two input terminals of the OR gates 21_2, 21_3, . . . are connected to a first time retrieval control line 22. An OR gate associated with the AND gates 20_1 is omitted. The other input terminal of the AND gates 20_1 is directly connected to the first time retrieval control line 22.

Output terminals of the AND gates 20_1, 20_2, . . . are connected to data input terminals of first flag registers 23_1, 23_2, . . . , respectively. Output terminals of the first flag registers 23_1, 23_2, . . . are connected to input terminals of second flag registers 24_1, 24_2, . . . , respectively. Output terminals of the second flag registers 24_1, 24_2, . . . are connected to the priority encoder 16 shown in FIG. 14 (omitted in FIG. 17), respectively, and in addition to the other ones of the input terminals of the OR gates 21_2, 21_3, . . . , respectively.

Pairs of first and second flag registers 23_1, 24_1; 23_2, 24_2; . . . correspond to the flag registers 15_1; 15_2, . . . shown in FIG. 14, respectively.

Applied to both the first flag registers 23_1, 23_2, . . . and the second flag registers 24_1, 24_2, . . . are a match result latch signal S1 which appears on a match result latch control line 25, so that input data entered from the respective data input terminals are latched. In the first flag registers 23_1, 23_2, . . . , there are latched the input data involved in the time point of a rise-up edge a of the match result latch signal S1. On the other hand, in the second flag registers 24_1, 24_2, . . . , there are latched the input data involved in the time point of a trailing edge b of the match result latch signal S1.

In the associative memory arranged as mentioned above, a match retrieval is performed in accordance with a manner as described below. It is now assumed, as shown in FIG. 17, that the word memories 11_1, 11_2, 11_3, 11_4, 11_5, 11_6, . . . store retrieval data A, B, C, D, E, F, . . . respectively.

To retrieve solely individual retrieval data, a first time retrieval timing signal S2 is supplied to the first time retrieval control line 22, when the retrieval is performed through inputting the reference data REF-DATA. Assuming that data "B" is inputted as the reference data REF-DATA, a logic "1" of match signal appears on the match line 14_2 associated with the word memory 11_2 in which data "B" has been stored, and is supplied to the AND gate 20-2. Simultaneously, the first time retrieval timing signal S2 is supplied via the first time retrieval control line 22 through the OR gate 20_2 to the AND gate 20_2. As a result, the AND gate 20_2 produces a logic "1" of signal. On the other hand, since logic "0" of signals appear on the other match lines 14_1, 14_3, 14_4, . . . , respectively, the associated AND gates 20-1, 20_3, 20_4, . . . produce logic "0" of signals, respectively.

The logic "1" of signal outputted from the AND gate 20_2 is latched by the first flag register 23_2 in timing of the rise-up edge a of the match result latch signal S1 appearing on the match result latch control line 25, and then latched by the second flag register 24_2 in timing of the subsequent trailing edge b of the match result latch signal S1.

On the other hand, logic "0" of signals are latched by the other first flag registers 23_1, 23_3, 23_4, . . . in the same timing as the logic "1" of signal is latched by the first flag register 23_2, and logic "0" of signals are latched by the other second flag registers 24_1, 24_3, 24_4, . . . in the same timing as the logic "1" of signal is latched by the second flag register 24_2.

In this manner, signals expressed by logic "0", "1", "0", . . . , which are latched by the second flag registers 24_1, 24_2, 24_3, . . . , respectively, are supplied to the priority encoder 16 as shown in FIG. 14 to generate an address signal AD of the word memory 11_2.

Next, there will be explained such a case where a retrieval involved in expansion of the data width is performed. Here, a case where two-word data consisting of data "B" and data "C" is retrieved, by way of example, will be explained.

In the same manner as the above-mentioned case, first, a retrieval of the data "B" is performed. As a result, signals expressed by logic "1" are latched by the first flag register 23_2 and the second flag register 24_2, respectively, which are associated with the word memory 11_2. Next, the data "C" is inputted as the reference data REF-DATA for retrieval. At that time, the time retrieval timing signal S2 is not supplied to the first time retrieval control line 22, and the first time retrieval control line 22 is kept logic "0". Performing the retrieval through inputting the data "C" as the reference data REF-DATA will induce match signals expressed by logic "1" on the match lines 14_3 and 14_5 which are associated with the word memories 11_3 and 11_5, respectively. Since the logic "1" of signal latched by the second flag register 24_2 has been supplied to the OR gate 21_3, the match signal appearing on the match line 14_3 is passed via the AND gate 20_3 to the first and second flag registers 23_3 and 24_3, so that a signal expressed by logic "1" representative of a match is latched by the first and second flag registers 23_3 and 24_3. On the other hand, since the logic "0" of signal latched by the second flag register 24_4 has been supplied to the OR gate 21_5, the match signal appearing on the match line 14_5 is inhibited by the AND gate 20_5, so that a signal expressed by logic "0" representative of a mismatch is latched by the first and second flag registers 23_5 and 24_5. In this manner, there is carried out a match retrieval for two-word data consisting of a pair of data "B" and data "C". Likewise, a match retrieval for three-word data or more word data may be implemented.

While the associative memory shown in FIG. 17 is provided with a data width expansion function, it is necessary for data to be expanded to two-word, three-word and so on to be stored in mutually adjacent word memories in a predetermined order, and thus it is impossible to perform a match retrieval in combination of plural data, in a case where they are stored in the reversed order, for example, in sequence of data "C" and data "B", or in a case where they are stored in mutually distant word memories. That is, the above-mentioned data width expansion function is unsuitable for retrieval of data formed in a group structure.

Further, in case of retrieval using an associative memory, hitherto, there is a case in which an object of retrieval is attained through performing a successive plural number of times of retrieval, for example, such a case that independently of data of a group structure being treated, an associative memory (e.g. FIG. 17) into which a data width expansion function is incorporated is used to implement retrieval using the data width expansion function. Likewise, also in a case where data of the group structure is treated as an object of retrieval, there may be a case in which an object of retrieval is attained through performing a successive plural number of times of retrieval, for example, as mentioned above, such a case that a match as to a plurality of data within a single data set is retrieved. In this case, there encounters a problem, as the third problem, how the associative memory is constituted to effectively implement a successive plural number of times of retrieval for data of a group structure having more complicated data structure. Specifically, there is not at all known a technology concerning a structure of an associative memory capable of retrieving at high speed and flexibly group structure of data which needs random and plural retrievals, and utilization of associative memories as well.

SUMMARY OF THE INVENTION

In view of the foregoing, it is therefore an object of the present invention to provide a method of using associative memories, which is suitable for data of a group structure, and a new structure of an associative memory suitable for storage of data of a group structure and retrieval thereof.

To achieve the above-mentioned object of the present invention, according to the present invention, there is provided a method of using associative memories having a plurality of arranged word memories each storing digital data, in which reference data is applied to retrieve the word memory or memories storing digital data having a bit pattern which coincides with a bit pattern of a whole or a predetermined part of the applied reference data. In the associative memories, digital data is stored in a first area of one of two-segmented parts of each of the word memories, and attribute data representative of attribute of the digital data is stored in a second area other than the first area of said each word memory; and a set of a predetermined attribute data and a predetermined digital data is applied as the reference data to the associative memories, so that said the associative memories perform a retrieval for the word memories storing digital data corresponding to the applied said predetermined digital data and in addition having attribute represented by the applied said predetermined attribute data.

As the first associative memory of the present invention, there is provided an associative memory having a plurality of arranged word memories each storing digital data, in which reference data is applied to retrieve the word memory or memories storing digital data having a bit pattern which coincides with a bit pattern of a whole or a predetermined part of the applied reference data.

(1) wherein said each word memory has a first area storing the associated digital data, and attribute data representative of attribute of the digital data stored in the first area has a bit pattern which repeats on a circulative basis at a period according to a number of attributes in the order of address of said each word memory.

In the first associative memory, it is acceptable that said each word memory stores fixedly on a second area thereof the attribute data having a bit pattern which repeats on a circulative basis at a period according to a number of attributes in the order of address of said each word memory.

As the second associative memory of the present invention, there is provided an associative memory having a plurality of arranged word memories each storing digital data, in which reference data is applied to retrieve the word memory or memories storing digital data having a bit pattern which coincides with a bit pattern of a whole or a predetermined part of the applied reference data.

(2) wherein said associative memory has a retrieval address range set circuit for setting an address range of the word memory as an object of match comparison with the applied reference data, among the whole range of addresses assigned to the plurality of arranged word memories, respectively.

In the method of using associative memories according to the present invention, a pair of digital data and attribute data representative of attribute of the digital data is stored in each of the word memories, and a retrieval is performed through inputting a set of the attribute data and the digital data as the reference data. This feature makes it possible to retrieve only a desired data having a desired attribute.

Further, according to the first associative memory of the present invention, the attribute data has a bit pattern which repeats on a circulative basis at a period according to a number of attributes in the order of address of said each word memory. This feature makes it possible to implement an associative memory suitable for flexible and high speed retrieval for group data.

The second associative memory of the present invention is provided a retrieval address range set circuit for setting an address range of the word memory as an object of match comparison with the applied reference data. Providing such a retrieval address range set circuit makes it possible to retrieve only a desired data to which a desired attribute is allotted in such a manner that data associated with the respective attributes are stored in the word memories within the respective address ranges, and at the time when a retrieval is effected, an address range over which data having a desired attribute is stored is set to determine as an object of retrieval only the word memories within the set address range.

Further, in case of the second associative memory, only a determination, before the use, as to how the address range associated with the respective attributes is set, permits the retrieval through storage of the data involved in different number of attribute. Thus, it is possible to provide an associative memory with a plenty of flexibility.

To achieve the above-mentioned object, according to the third associative memory of the present invention, there is provided an associative memory comprising:

(3_1) a plurality of word memories for storing a plurality of storage data belonging to a plurality of data groups respectively every storage data; and (3_2) a match detection circuit having a first mode in which when a match between storage data stored in a predetermined word memory and entered reference data is detected, a match signal representative of a match is produced on a match line associated with the predetermined word memory, and a second mode in which when the match is detected in a predetermined word memory at the current retrieval, and a match was detected, at the previous retrieval, in an arbitrary word memory storing storage data constituting a data group to which storage data stored in the predetermined word memory belongs, a match signal is produced on a match line associated with the predetermined word memory.

The third associative memory of the present invention may be arranged, as one of the aspects, as set forth below:

The third associative memory comprising:

(3_3) a plurality of word memories each for storing a plurality of storage data belonging to a plurality of data groups each comprising a set of a plurality of storage data each consisting of a pair of attribute and data, respectively, every storage data;

(3_4) attribute match detection circuits each for detecting a match or mismatch between attributes in storage data stored, associated with the plurality of word memories, respectively, and attribute in a reference data applied consisting of a pair of attribute and data;

(3_5) data match detection circuits each for detecting a match or mismatch between data in storage data each consisting of a pair of attribute and data stored, associated with the plurality of word memories, respectively, and data in a reference data applied consisting of a pair of attribute and data;

(3_6) registers each for storing information concerning a match or mismatch between the storage data and the reference data, said registers each corresponding to the associated one of said plurality of word memories;

(3_7) data lines provided on each word memory group consisting of word memories each for storing storage data constituting the same said data group;

(3_8) first switch circuits each for transmitting to the associated one of said data lines, upon receipt of detection of a match of attribute through the retrieval by the associated said attribute match detection circuit, a retrieval result concerning a match or mismatch of the associated said register, said first switch circuits each corresponding to the associated one of said plurality of word memories;

(3_9) gate circuits each for transmitting to the associated one of said registers, when detection of a match of both attribute and data through the current retrieval by the associated said attribute match detection circuit and the associated said data match detection circuit is detected, and in addition when information representing a match through the previous retrieval is supplied to the associated one of said data lines, information representing a match through the current retrieval, said gate circuits each corresponding to the associated one of said plurality of word memories; and (3_10) second switch circuits each for transmitting to the associated one of said gate circuits, upon receipt of detection of a match of attribute through the current retrieval by the associated said attribute match detection circuit, information representing a match or mismatch through the previous retrieval, which information is supplied to the associated said data line, said first switch circuits each corresponding to the associated one of said plurality of word memories.

It is preferable that the third associative memory further comprises attribute discriminating circuits each for discriminating whether or not attribute of storage data stored in the associated said word memory is a predetermined attribute, said attribute discriminating circuits each corresponding to the associated one of said plurality of word memories; and said data lines are connected in series through third switch circuits each corresponding to the associated one of said plurality of word memories, between said word memories mutually adjacent to span a plurality of said word memory groups.

It is preferable that said third switch circuits are each controlled by the associated said attribute discriminating circuits or a data line connection control circuit provided on each word memory.

According to the third associative memory of the present invention, a match detection circuit noted in the above-referenced item (3_2) is provided with the second mode. Specifically, storage data each consisting of a pair of attribute and data are stored, and to perform retrieval reference data consisting of a pair of attribute and data is inputted. Further, in the third associative memory of the present invention, the data lines noted in item (3_7) is provided, and the first switch circuits (3_8) are used to transmit to the data lines a retrieval result as to whether or not a match through the previous retrieval is detected. The second switch circuits (3_10) are used, upon receipt of a match of attribute through the current retrieval, to take in a signal on the data line into the gate circuit. This feature permits a retrieval according to an arbitrary combination of the storage data stored in the word memories within the same word memory group.

It is acceptable that the third associative memory of the present invention is arranged in such a manner that the length of the respective data lines is fixedly determined in compliance with a number of data constituting a data group (data set), or there are provided in mid way of the data line a lot of switch circuits and a lot of control lines each for turning on or off the associated switch circuits, and those switch circuits are turned on or off in compliance with the number of data constituting a data group, so that a length of the data line is varied. On the other hand, if there are provided the third switch circuits each for the associated word memory, and the third switch circuits are controlled in their turn-on or off in accordance with the attribute stored in the associated word memories or new attribute data, respectively, only the essential work such that storage data are stored in the word memories permits the data lines to be automatically formed in accordance with the number of data constituting a data group. In this case, even if there mixedly exist data groups different in the number of data, it is possible to adaptively form the data lines.

Further, to achieve the object of the present invention, as the fourth associative memory of the present invention, there is provided an associative memory having a plurality of word memories each for storing storage data, and retrieval auxiliary data sequential output means for sequentially outputting retrieval auxiliary data to issue reference data to be compared with the associated storage data by means of coupling with sequentially applied reference data, wherein retrieval for word memories storing a predetermined storage data is performed.

In such an associative memory, it is preferable that said retrieval auxiliary data sequential output means comprises:

a retrieval auxiliary data register group for storing a series of retrieval auxiliary data; and control means for designating and controlling said retrieval auxiliary data register group, said control means being defined in an address and arranged to receive address data representative of said address along with said reference data, wherein said control means, which is designated by said address data, controls on the basis of the received address data along with said reference data and a number of times of said retrieval as well said retrieval auxiliary data register group to sequentially output the retrieval auxiliary data.

Further, it is also acceptable that said retrieval auxiliary data sequential output means comprises:

a retrieval auxiliary data register group for storing a series of retrieval auxiliary data;

control means for designating and controlling said retrieval auxiliary data register group; and a channel designation data register for storing channel designation data to designate said control means, wherein the retrieval auxiliary data are sequentially outputted on the basis of said control means designated by the channel designation data stored in said channel designation data register and a number of times of said retrieval through inputting the reference data.

Further, it is preferable that the fourth associative memory of the present invention has a reset terminal arranged to receive a sequence reset signal to initialize an output sequence of the retrieval auxiliary data of said retrieval auxiliary data sequential output means.

According to the fourth associative memory of the present invention, a plurality of retrieval auxiliary data such as mask data, attribute data, etc. as mentioned above are stored on a rewritable basis, and in retrieval there are inputted reference data and in addition data indicating as to what retrieval auxiliary data is to be used. Accordingly, during a series of retrievals, there is no need to perform operation, for example, rewriting of the mask data and the like, and thus a procedure for retrieval is simplified, and in addition it is possible to contribute to enhancement of a retrieval speed in a series of retrievals.

Further, according to another example, while a plurality of retrieval auxiliary data such as mask data, attribute data, etc. as mentioned above are stored on a rewritable basis, as different point from the above-mentioned example, there is provided designation data register arranged to store on a rewritable basis data to designate the control means for controlling retrieval auxiliary data. Thus, in retrieval there is no need to designate one by one as to what retrieval auxiliary data is to be used for retrieval, but it is sufficient that new data is inputted into the designation data register only when retrieval auxiliary data to be used for retrieval is altered. Thus, it is possible to more simplify the procedure for retrieval.

In a case where a series of retrieval comprising a plural number of times of retrieval is performed, there is frequent such a case that retrieval patterns can be placed in a pattern such that first, some first mask data and some first attribute data are used in their combination to perform retrieval, and next, the same first mask data as the above-noted data and the second attribute data different from the above-noted data, and so on. Therefore, in the fourth associative memory of the present invention, an adoption of conception of the control means for indicating retrieval auxiliary data and in addition an address to designate the control means permits a series of retrievals to be carried out only through sequentially inputting the address data together with reference data. Alternatively, a series of retrievals is carried out only through inputting once channel designation data once, and thereafter sequentially inputting reference data. Thus, it is possible to more simplify the procedure of retrieval.

Further, providing the above-mentioned reset terminal arranged to initialize an output sequence of the retrieval auxiliary data of the retrieval auxiliary data sequential makes it possible to initiate a new retrieval, after termination of the previous retrieval, through a reset being made at only a necessary time.

BRIEF DESCRIPTION OF THE DRAWINGS

FIG. 1 is an illustration showing a memory structure according to an embodiment of the present invention;

DESCRIPTION OF THE PREFERRED EMBODIMENTS

Hereinafter, there will be described embodiments of the present invention.

Figure 16:
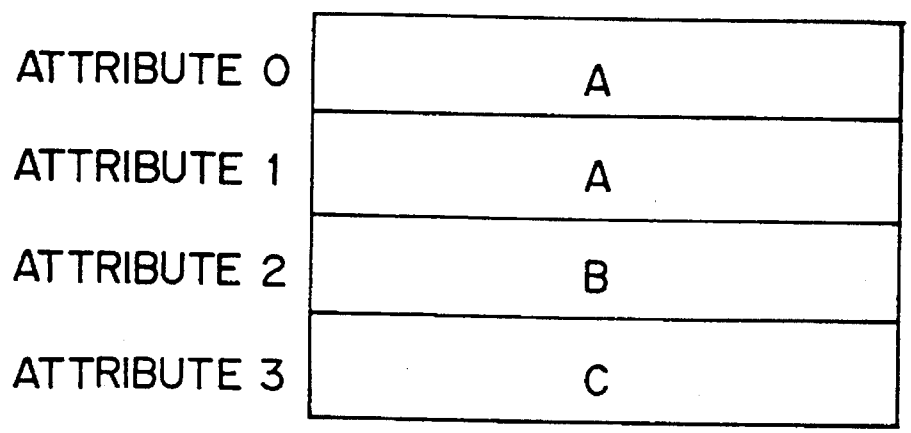
FIG. 16 is an illustration showing an arrangement of data, to each of which an attribute is appended, stored in an associative memory.
Figure 16:
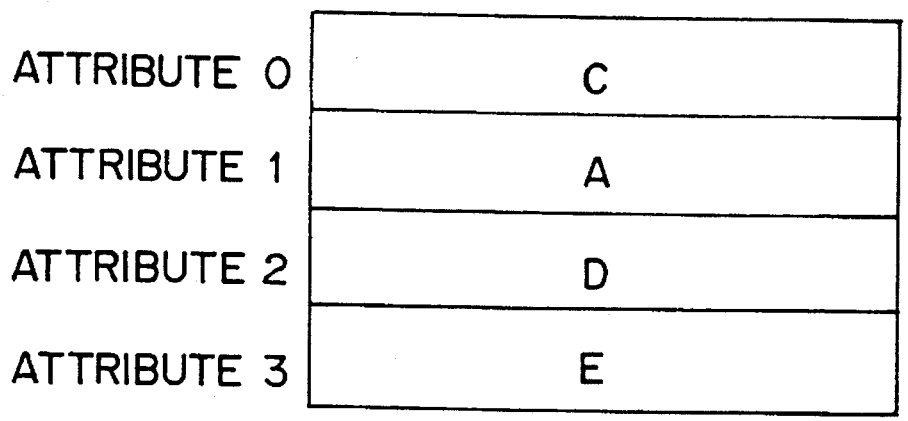
Figure 16:
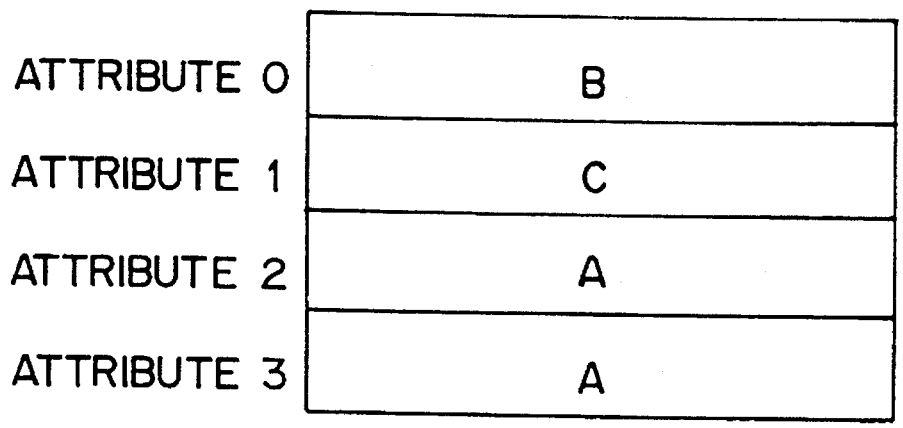

FIG. 1 is an illustration showing a memory structure according to an embodiment of the present invention, which corresponds to that shown in FIG. 16 related to the prior art.

It is assumed that a general-purpose associative memory comprises a plurality of word memories each consisting of m bits (e.g. 16 bits). K high-order bits (e.g. 2 bits) of the word memory are defined as an area (referred to as the second area) for storing attribute data representative of an attribute, and the remaining (m–k) bits (e.g. 16–2=14 bits) are defined as an area (referred to as the first area) for storing essential data to which the associated attribute is appended. Thus, each word memory stores both the attribute and the essential data. In retrieval, the retrieval is effected with both items of the attribute and the essential data. For example, if the retrieval is effected with the 'attribute 0' and the data "A", the data shown in the uppermost stage of FIG. 1 will be retrieved.

Figure 2:
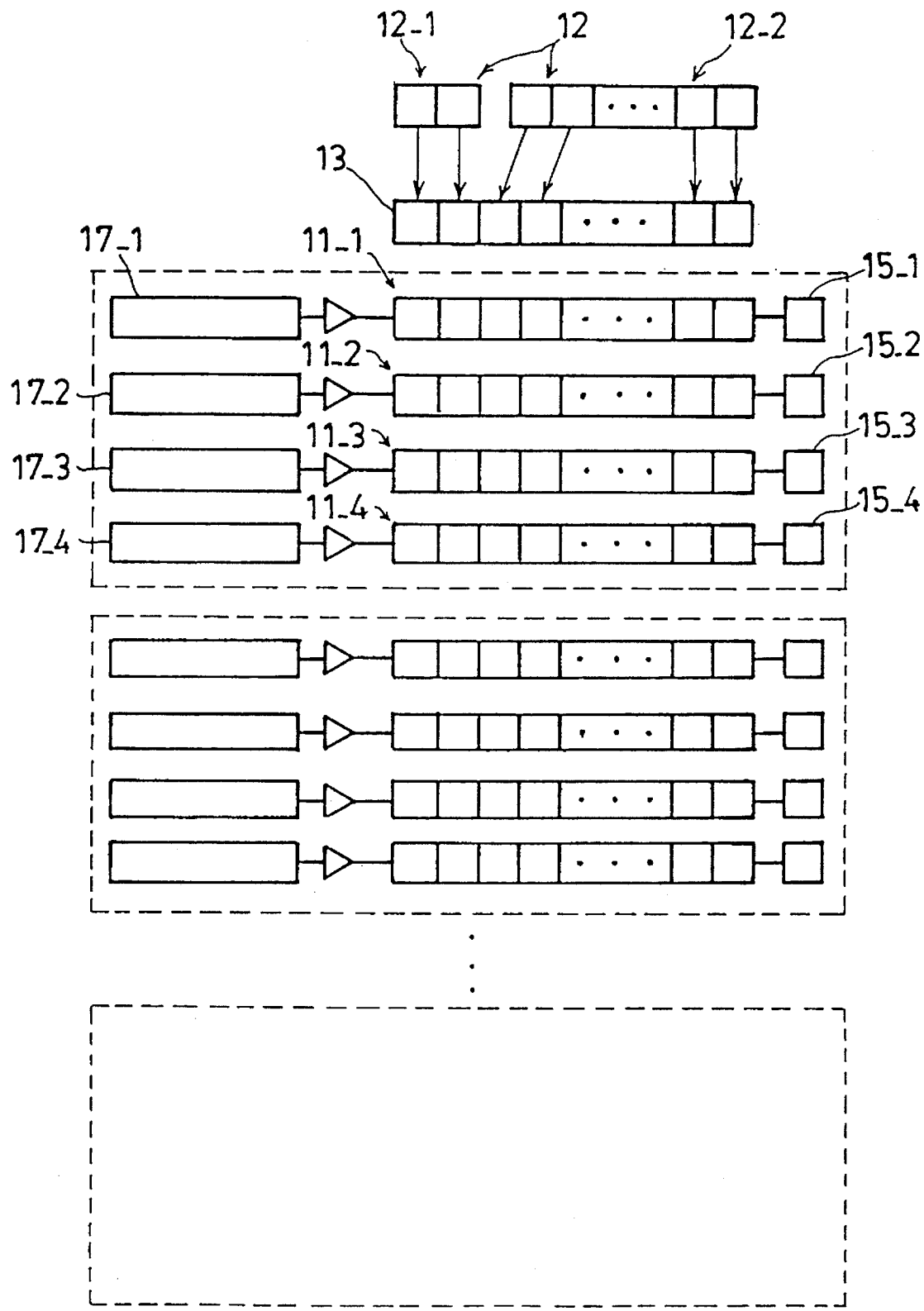
FIG. 2 is a block diagram of an associative memory.
Figure 14:
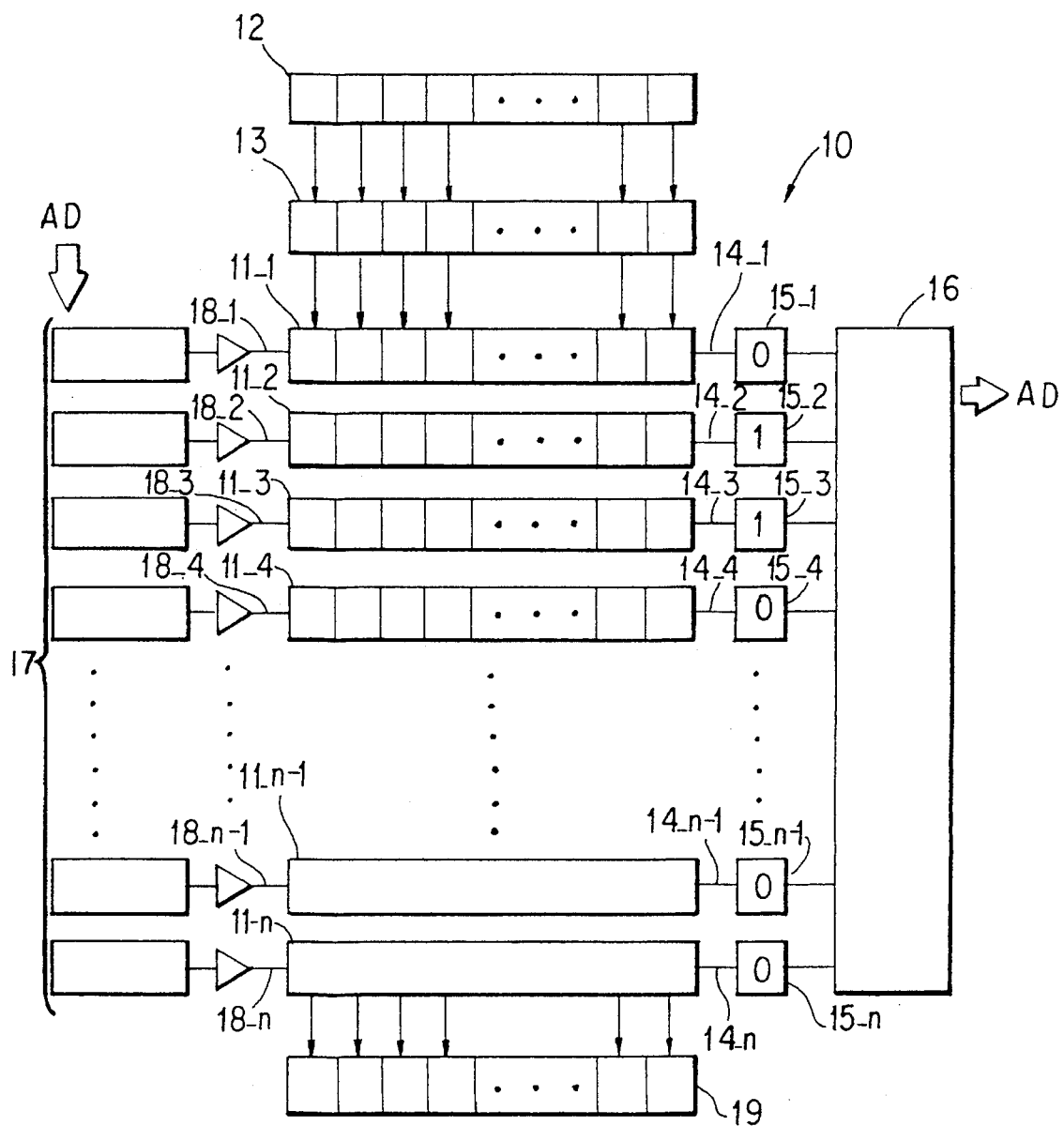
FIG. 14 is a circuit block diagram showing an associative memory according to the prior art by way of example.
Figure 15:
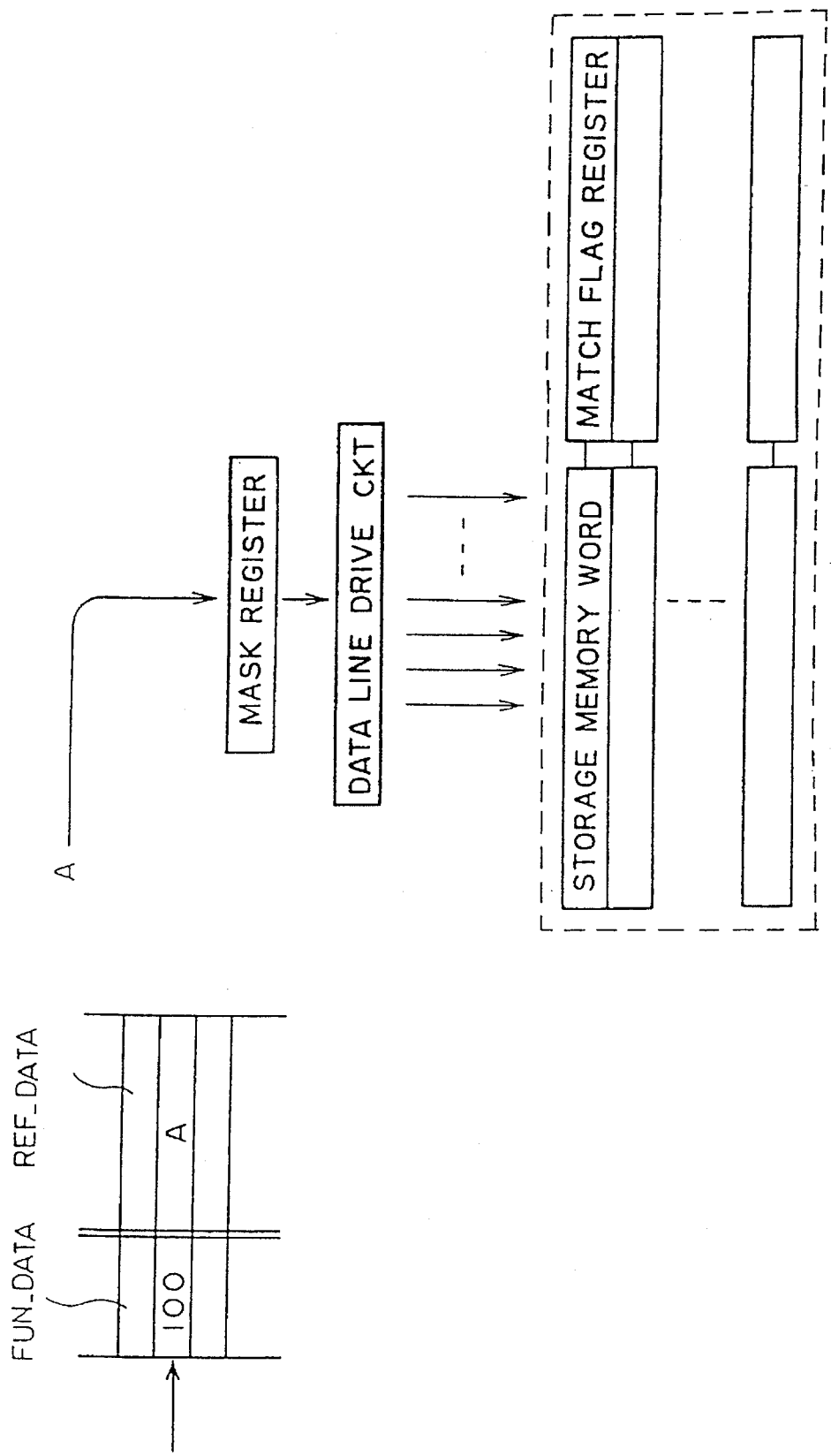
FIG. 15 is a functional block diagram of the conventional associative memory.

FIG. 2 is a block diagram of an associative memory, which is useful for understanding the above-mentioned concept. The associative memory shown in FIG. 2 is essentially the same as that shown in FIG. 14, but slightly different in the drawing as a matter of convenience for explanation, omitting partially unnecessary blocks. In FIG. 2, the same parts are denoted by the same reference numbers as those in FIG. 14.

Two high-order bits of each of word memories $11\_1$, $11\_2$, ..., $11\_n$, consisting of m bits, are used to store attribute data, and the remaining (m–2) bits are used to store data to which an attribute is appended. In retrieval, two high-order bits of a reference data register 12 is used as an attribute retrieval register $12\_1$ in which attribute data for retrieval is stored, and the remaining portions (data register $12\_2$) of the reference data register 12 are used as the reference data register in meaning of the prior art concern as described referring to FIG. 14. Thus, the reference data register 12 stores the attribute data and the reference data in meaning of the prior art concern. In this situation, there is performed the retrieval for a desired storage data to which an attribute represented by the attribute data used for the retrieval is appended. In other words, there is excluded the retrieval for the same storage data but different in the attribute.

Next, there will be explained the first associative memory according to an embodiment of the present invention, in which attribute data are stored on a fixing basis.

While the block diagram of an associative memory shown in FIG. 2 is available for explanation of the first associative memory according to the embodiment of the present invention, it is noted that an arrangement of each of the word memories $11\_1$, $11\_2$, ..., $11\_n$ is different from that of the conventional general-purpose associative memory.

Figure 3:
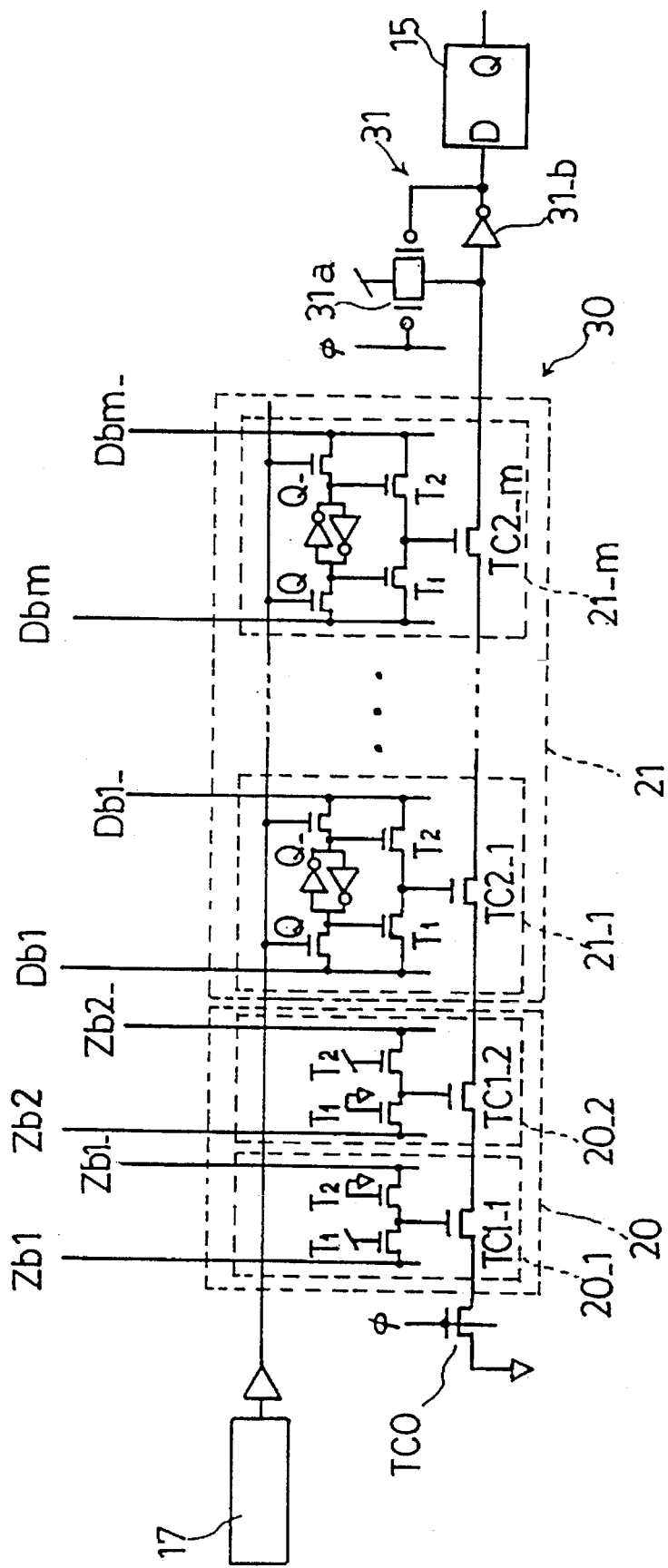
FIG. 3 is a circuit diagram of a unit of word memories involved in an embodiment of the first associative memory of the present invention.

FIG. 3 is a circuit diagram of a unit of word memories involved in an embodiment of the first associative memory of the present invention. This circuit is an example of a circuit arrangement such that an SRAM is adopted as a fundamental element, and a match with the reference data is detected by a NAND type of match detection circuit.

The word memory shown in FIG. 3 comprises a bit cell group 20 comprising a first attribute bit cell $20\_1$ and a second attribute bit cell $20\_2$, and a memory cell group 21 comprising memory cells $21\_1$, ..., $21\_m$ having m bits (e.g. 16 bits) of SRAM structure.

The first attribute bit cell $20\_1$ comprises two transistors T1 and T2, which are connected in series between a bit line Zb1 and a bit bar line Zb1_, and a transistor $TC1\_1$ of which a gate electrode is connected to a connection point of the transistors T1 and T2. A gate of the transistor T1 is set to a logic "1", while a gate of the transistor T2 is set to a logic "0". When the logic "1" of signal and the logic "0" of signal are applied to the bit line Zb1 and the bit bar line Zb1_, respectively, which are connected to the attribute retrieval register $12\_1$, the transistor T1 turns on, so that the logic "1" of signal on the bit line Zb1 is applied to the gate electrode of the transistor $TC1\_1$ whereby the transistor $TC1\_1$ also turns on. This implies a state, with respect to the first attribute bit cell $20\_1$, in which a match between the content stored on a fixing basis in the first attribute bit cell $20\_1$ and the inputted attribute data for retrieval is attained. Reversely, when the logic "0" of signal and the logic "1" of signal are applied to the bit line Zb1 and the bit bar line Zb1_, respectively, the gate electrode of the transistor $TC1\_1$ takes the logic "0", so that the transistor $TC1\_1$ turns off. This implies a mismatch state regarding the first attribute bit cell $20\_1$.

Likewise, according to the embodiment shown in FIG. 3, the second attribute bit cell $20\_2$ stores the opposite data from that in first attribute bit cell $20\_1$. Hence, when the signal supplied from the attribute retrieval register $12\_1$ takes the logic "0" ("0" on the bit line Zb2, and "1" on the bit line Zb2_), a match state is attained.

That is, according to the embodiment shown in FIG. 3, the "match state" is attained when two bits as the attribute bit are of (1,0).

Regarding the memory cell $21\_1$, ..., $21\_m$, the voltage values to be applied to gate electrodes of the transistors T1 and T2 are set up depending on nodes Q and Q_ of the SRAM, respectively, which is accessed by the decoder 17. The match detection operation is the same as that in the attribute bit cell $20\_1$ and $20\_2$.

A NAND type of match detection circuit 30, which comprises mutually serially connected transistors $TC1\_1$, $TC1\_2$, $TC2\_1$, ..., $TC2\_m$ and the like, is equipped with a control transistor TC0 and a match detection amplifier 31, which are controlled by a control clock φ. First, the control clock φ takes the logic "0", so that an input node of the match detection amplifier 31 is pre-charged whereby an output of an inverter 31b becomes the logic "0". While the control transistor TC0 is kept in a turn-off state.

Retrieval data have been beforehand received from the attribute retrieval register $12\_1$ and the retrieval data register $12\_2$ via the respective bit lines and bit bar lines: Zb1, Zb1_; Zb2, Zb2_; Db1, Db1_; ..., Dbm, Dbm_. And a match or a mismatch is determined on each of the attribute bit cell 20_1 and 20_2, and the memory cells 21_1, ..., 21_m. As a result, with respect to the cells involved in the match, the gate voltage of the associated ones of the transistors TC1_1, TC1_2, TC2_1, ..., TC2_m, which constitutes the NAND type of match detection circuit, becomes a logic "1", so that the associated transistors turn on.

In such a state, when the control clock φ becomes the logic "1", discharged is an input node of an inverter 31b of the match detection amplifier 31 associated with only the word memory of which all cells are involved in the match, so that a logic "1" of match signal is produced from the inverter 31b whereby the logic "1" is stored in the associated match flag register 15.

It is noted that the match signal can only be produced when there appears a match of not only the storage data stored in the memory cells 21_1, ..., 21_m, but also the attribute data. Hence, a definition of the attribute data for attributes of the respective data constituting each data set makes it possible to perform the retrieval on each attribute of each data set. In the associative memory in which the attribute data have been beforehand build on a hardware basis in the manner as mentioned above, it is sufficient to set up the attribute data as one of control data in the attribute retrieval register 12_1 shown in FIG. 2. Consequently, the use of such an associative memory makes it possible to implement systems capable of performing an access with the exterior without reducing a bit length regarding the corresponding a word of the associative memory.

Figure 4:
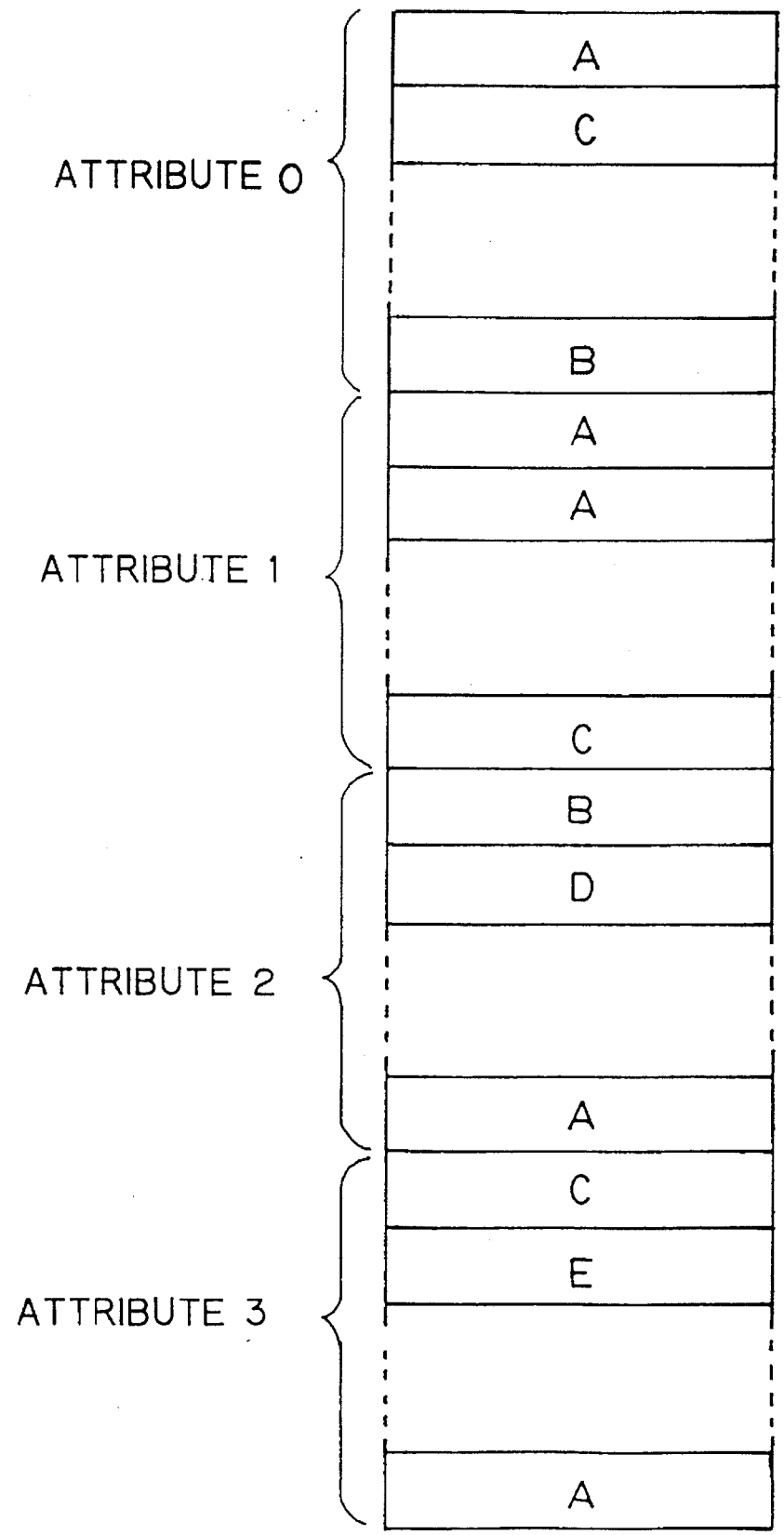
FIG. 4 is an illustration showing a memory structure of the second associative memory of the present invention.

FIG. 4 is an illustration showing a memory structure of the second associative memory of the present invention.

According to the embodiment, a number of word memories are segmented into four areas of attributes 0, 1, 2 and 3, and data sets are stored at random in the respective areas. For example, the uppermost stage of data set (A, A, B, C) shown in FIG. 1 are distributively stored, in FIG. 4, in the respective uppermost stage of word memories within the areas of attributes 0, 1, 2 and 3.

In the embodiment of the second associative memory of the present invention, which will be described more in details hereinafter, to retrieve for example data to which attribute 1 is appended, only the area of the word memory associated with attribute 1 is an object of retrieval. Specifically, assuming that there are, for example, 100 data sets, and further it is assumed that data involved in attribute 0 of the respective data sets are stored in address ranges 1–100 of the associative memory; data involved in attribute 1 are stored in address ranges 101–200; data involved in attribute 2 are stored in address ranges 201–300; and data involved in attribute 3 are stored in address ranges 301–400. To perform a match comparison regarding data to which attribute 1 is appended, first, address ranges 101–200 of the word memory storing data involved in attribute 1 are set up to be selected as an object of retrieval. This example will be explained referring to FIG. 5 hereinafter.

Figure 5:
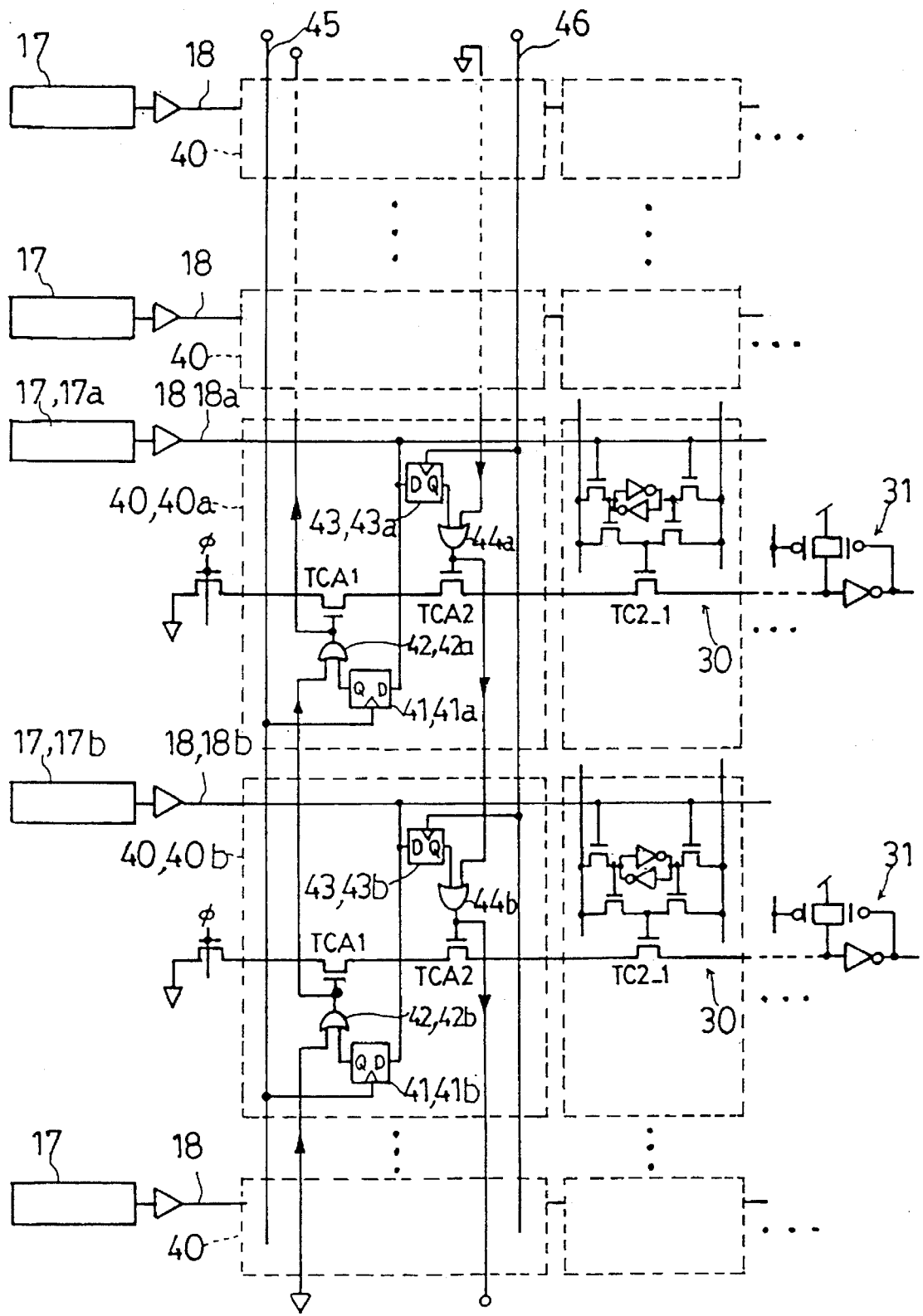
FIG. 5 is a partial circuit diagram showing peculiar parts involved in an embodiment of the second associative memory of the present invention.

FIG. 5 is a partial circuit diagram showing peculiar parts involved in an embodiment of the second associative memory of the present invention. In FIG. 5, it is assumed that the lower end of the figure implies the high-order address, and the upper end implies the low-order address.

A major different point of the circuit shown in FIG. 5 from that in FIG. 3 is a point that a portion of the attribute bit cell group 20 in FIG. 3 is replaced by a retrieval address range setting circuit. A scheme of setting of address ranges for the retrieval will be explained hereinafter.

First, it is assumed that a decoder 17a connected to a retrieval address range setting circuit 40a is selected in accordance with the least significant address of a certain retrieval range, and a word line 18a extending from the decoder 17a takes a logic level "1". At that time, if the positive pulse is applied to a least significant address setting control line 46, a low order address flip-flop 43a receives the logic "1" data appearing on the word line 18a. Simultaneously, since all word lines 18 of the other decoder 17 take a logic level "0", the logic "0" is applied to a low order address flip-flop 43 of each of the other retrieval address range setting circuits 40.

However, an output of the low order address flip-flop 43a of the retrieval address range setting circuit 40a is supplied to an OR circuit 44a. Thus, the OR circuit 44a outputs a logic "1" of signal independently of the other input "0" thereof applied from the retrieval address range setting circuits 40 of the low order address (upper end in FIG. 5). As a result, the transistor TCA2 forming one of serial connection transistors of the NAND type of match detection circuit 30 turns on. An output of the OR circuit 44a is supplied also to the next stage (upper end) of OR circuit 44b, so that the next stage of transistor TCA2 also turns on. Likewise, hereafter all transistors TCA2 involved in high order address turn on.

Next, it is assumed that a decoder 17b connected to a retrieval address range setting circuit 40b is selected in accordance with the most significant address of a certain retrieval range, and a word line 18b extending from the decoder 17b takes a logic level "1". In this case, likewise, if the positive pulse is applied to a most significant address setting control line 45, a high order address flip-flop 41b receives the logic "1" data appearing on the word line 18b. This causes the transistor TCA1 forming one of serial connection transistors of the NAND type of match detection circuit 30 to turn on through an OR circuit 42b.

Likewise, a logic "0" is applied to a high order address flip-flop 41 of each of the other retrieval address range setting circuits 40. Nevertheless, all transistors TCA1 involved in low order address (upper in FIG. 5) hereafter turn on through the output of the OR circuit 42b.

That is, according to the above-described example, what both the transistors TCA1 and TCA2 turn on among the serial transistors of the NAND type of match detection circuit 30 is established between the least significant address and the most significant address of the address range. If the least significant address and the most significant address are given by addresses 101 and 200, respectively, data involved in attribute 1 therebetween concern an object of retrieval.

In this manner, after establishing a retrieval address range, if the NAND type of match detection circuit 30 is precharged, and a reference data is applied to the bit line and the bit bar line of each memory cell to perform the retrieval, it is possible to implement a retrieval of only the address range as an object of retrieval, that is, a content retrieval permitting a designation of attributes.

According to this scheme, different from the above-mentioned embodiment, there is no need to increase an attribute bit width, even if the number of attributes of each data set is increased, it is sufficient only to alter setting of the address range. Thus it is possible to assign a higher degree of freedom of attribute to each data set.

Figure 6:
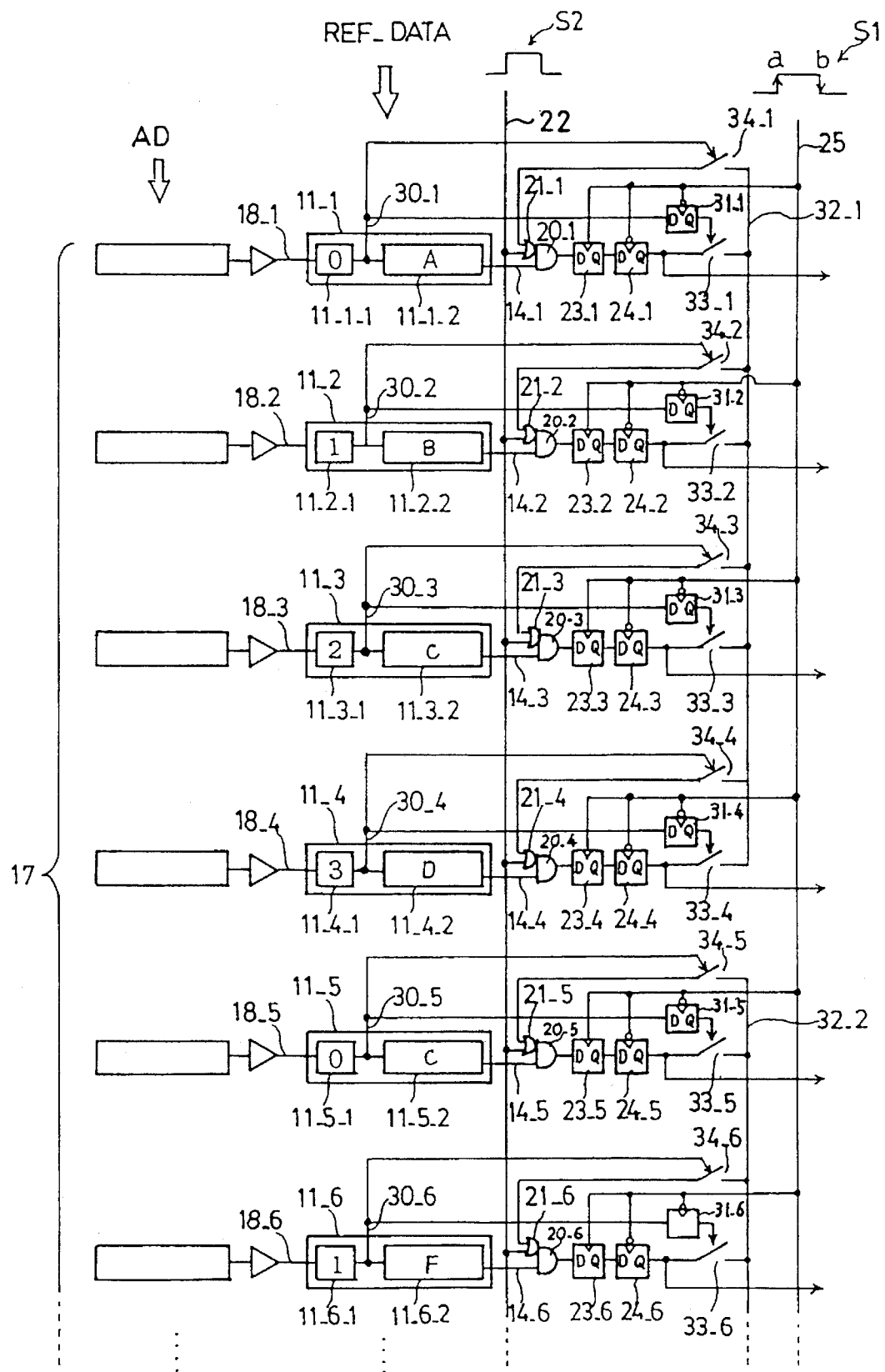
FIG. 6 is a block diagram of the third associative memory according to an embodiment of the present invention.
Figure 17:
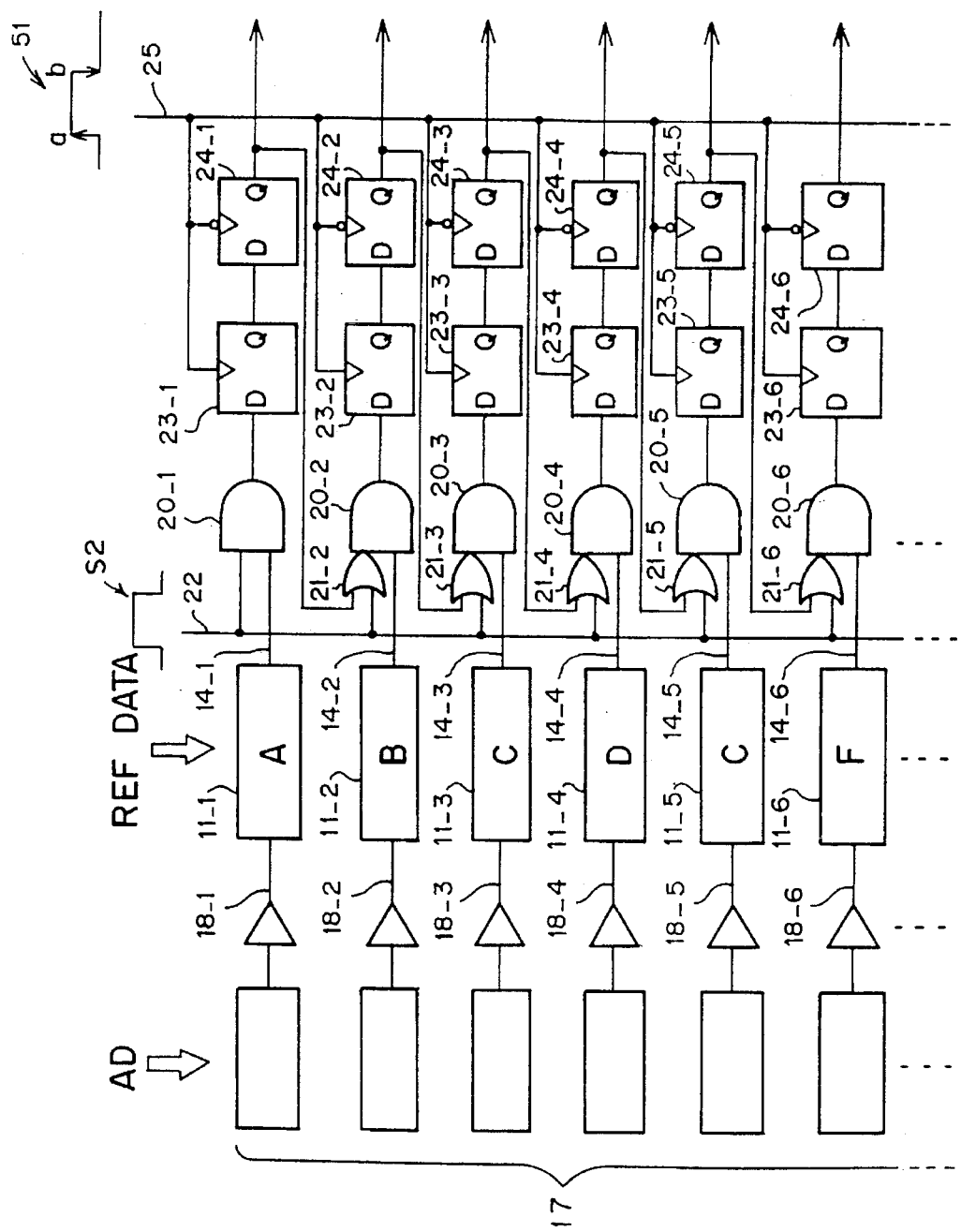
FIG. 17 is a block diagram showing an associative memory having data expansion function by way of example.

FIG. 6 is a block diagram of the third associative memory according to an embodiment of the present invention. In FIG. 6, the same parts are denoted by the same reference numbers as those of FIG. 17. Only different points will be described.

Word memories 11_1, 11_2, ... comprise attribute storage units 11_1_1, 11_2_1, ... each for storing an attribute and data storge units $11_{13}$ $1\_2, 11\_2\_2, \ldots$ each for storing data, respectively. The word memories each store storage data consisting of a pair of mutually associated attribute and data. As shown in FIG. 6, it is assumed that the word memories $11\_1, 11\_2, 11\_3$ and $11\_4$ store attribute 0 and data 'A', attribute 1 and data 'B', attribute 2 and data 'C' and attribute 3 and data 'D', respectively. Similarly, the word memories $11\_5, 11\_6, \ldots$ store attribute 0 and data 'C', attribute 1 and data 'F', ..., respectively. To effect the retrieval, reference data REF_DATA, which consists of a pair of attribute and data, is applied.

The word memories $11\_1, 11\_2, \ldots$ are provided with attribute match lines $30\_1, 30\_2, \ldots$, to which each signal representative of a match or mismatch concerning only the attribute is supplied, as well as the conventional match lines $14\_1, 14\_2, \ldots$, respectively, to which each match signal is supplied when the storage data (both the attribute and the data) coincides with the applied reference data (both the attribute and the data). With respect to detection of a match of only the attribute and a match of both the attribute and the data, it is possible to implement such a function with the use of the conventional match detection circuit. Thus, the illustration of such a match detection circuit and the explanation will be omitted.

There are provided third flag registers $31\_1, 31\_2, \ldots$ which are associated with the word memories $11\_1, 11\_2$, ..., respectively. The attribute match lines $30\_1, 30\_2, \ldots$ are extended to data input terminals of the associated third flag registers $31\_1, 31\_2, \ldots$, respectively. Further, in the associative memory according to the present embodiment, there are provided data lines $32\_1, 32\_2, \ldots$ each on the associated word memory group comprising word memories each storing data belonging to the associated data set. Furthermore, there are provided first switches $33\_1, 33\_2$, ... between the data lines $32\_1, 32\_2, \ldots$ and output terminals of the third flag registers $31\_1, 31\_2, \ldots$, respectively. The first switches $33\_1, 33\_2, \ldots$ are each constituted of a transistor and the like. Also with respect to other switches described later, it is the same as this constitution. The first switches $33\_1, 33\_2, \ldots$ turn on when the associated third flag registers $31\_1, 31\_2, \ldots$ each latch a logic "1" of signal, respectively, and they turn off when latching a logic "0" of signal. The third flag registers $31\_1$, $31\_2, \ldots$ latch signals appearing on the associated attribute match lines $30\_1, 30\_2, \ldots$, respectively, in timing of the trailing edge b of the match result latch signal S1 which appears on the match result latch control line 25.

Furthermore, there are provided second switches $34\_1$, $34\_2, \ldots$ between the data lines $32\_1, 32\_2, \ldots$ and input terminals of OR gates $21\_1, 21\_2, \ldots$, respectively. The second switches $34\_1, 34\_2, \ldots$ are controlled in such a manner that they turn on when signals of the associated attribute match lines $30\_1, 30\_2, \ldots$ each take a logic level "1" representative of a match, and they turn off when taking a logic "0" representative of a mismatch. Incidentally, the associative memory shown in FIG. 6 is provided with, different from that shown in FIG. 17, an OR gate $21\_1$ before the AND gate $20\_1$ associated with the uppermost stage of word memory $11\_1$.

In the associative memory arranged as described above, a match retrieval is effected in such a manner as set forth below. With respect to the retrieval of a word of sole data and the first retrieval, those retrievals may be implemented in the same manner as the conventional associative memory having the word expansion function. Therefore, the explanation of those retrievals will be omitted. Now, it is assumed in the first retrieval that a logic "1" has been latched by the first and second flag registers $23\_2$ and $24\_2$ associated with the word memory $11\_2$ in compliance with the reference data REF_DATA consisting of attribute 1 and data "B". In this condition, upon receipt of a match of the attribute, a logic "1" signal appears on the attribute match line $30\_2$ associated with the word memory $11\_2$. As a result, a logic "1" of signal is latched also by the associated third flag register $31\_2$, so that the associated first switch $33\_2$ turns on, whereby a logic "1" of signal stored in the associated second flag register $24\_2$, which logic "1" is representative of a match of both the attribute and the data, is supplied to the data line $32\_1$. Simultaneously, the associated second switch $34\_2$ also turns on. However, this is useless operation for the first retrieval.

Next, let us consider a retrieval through inputting a reference data REF_DATA consisting of attribute 3 and data "D". In this case, similar to the case of the associative memory shown in FIG. 17, the first time retrieval control line 22 is kept at a logic level "0". In this state, upon receipt of a match of the attribute, a logic "1" of signal appears on the attribute match line $30\_4$ associated with the word memory $11\_4$. As a result, the associated second switch $34\_2$ turns on, so that the logic "1" of signal, appearing on the data line $32\_1$, of the associated second flag register $24\_2$ is applied through an OR gate $21\_4$ to an AND gate $20\_4$. Hence, when a match of both the attribute and the data "D" is detected in the word memory $11\_4$ and a logic "1" of match signal is supplied to a match line $14\_4$, a logic "1" of signal is latched, by the associated first and second flag registers $23\_4$ and $24\_4$ in compliance with the match result latch signal S1 which appears on the match result latch control line 25, in rise-up and trailing edges of the latch signal S1, respectively. Whereas a logic "1" of signal supplied to the attribute match line $30\_4$ is latched in the trailing edge of the latch signal S1 by the associated third flag register $31\_4$, so that the associated first switch $33\_4$ turns on whereby the logic "1" of signal is supplied to the data line $32\_1$. In the second time of retrieval, a logic "0" of signal representative of a mismatch of attribute is supplied to the attribute match line $30\_2$ associated with the word memory $11\_2$, and thus the associated third flag register $31\_2$ stores a logic "0" of signal, whereby the first switch $33\_2$ associated with the word memory $11\_2$ turns off in timing of trailing edge of the latch signal S1. At that time, however, the second times of retrieval result has been stored in the first flag register $23\_1$.

With respect to encoding of the bit address, a logic "1" of signal of the second flag register $24\_4$ associated with the word memory $11\_4$ is applied to the priority encoder 16 (see FIG. 14) so that the address of the word memory $11\_4$ is derived. Here, it is known beforehand that attribute 3 has been stored in the word memory $11\_4$. Accordingly, when it is desired that data involved in, for example, the attribute 2 within the same group is read out, it may be sufficient that the address of the word memory $11\_3$ is determined through subtracting 1 from the derived address, and the determined address is applied to the address decoder 17 to read the content of the word memory $11\_3$.

In the second time of retrieval, if the retrieval is carried out with the use of the reference data consisting, for example, attribute 3 and data "B", instead of the reference data consisting attribute 3 and data "D", regarding the word memory $11\_4$, the associated second switch $34\_4$ turns on since a match of the attribute is attained, so that a logic "1" of signal appearing on the data line $32\_1$ is taken in. Whereas, since the data is different, a logic "0" of signal representative of a mismatch is supplied to the match line 14_4, so that the first and second flag registers 23_4 and 24_4 latch a logic "0" indicating that no match is detected. Further, regarding the word memory 11_2 involved in a match of data "B", it involves no match of the attribute and thus involving no match of both the attribute and the data.

In such a manner as mentioned above, according to the embodiment shown in FIG. 6, it is possible to implement a retrieval even in a case where data to be retrieved are stored in mutually distant word memories as far as those within the same group, or a case where the retrieval is effected independently of a sequence of data stored in the word memories.

According the embodiment as described above, the data line 32_1, 32_2, . . . , are each fixed in length on the assumption that the number of data belonging to a single group is predetermined. However, providing such a fixed length of data line causes such a necessity that a maximum of the number of data belonging to a single group is estimated to provide a data line having a length corresponding to the maximum data number. This causes useless word memories when data groups each are constituted of data less than the maximum. Thus, while it is preferable to adopt a variable length of data line to meet the number of data belonging to a single group, it is a problem how to provide a variable length of data line.

Figure 7:
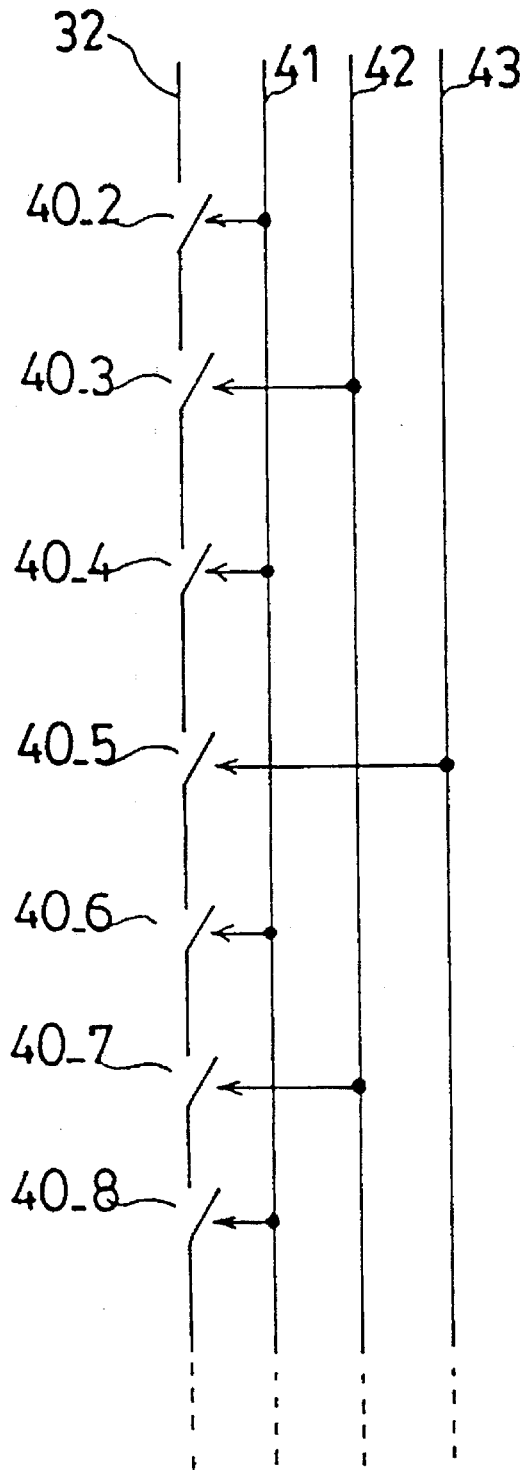
FIG. 7 is a typical illustration showing a scheme of implementing a variable length of data line.

FIG. 7 is a typical illustration showing a scheme of implementing a variable length of data line.

Data line 32 is extended over a plurality of word memories 11_1, 11_2, 11_3, . . . . On the data line 32 there are arranged in series switches 40_2, 40_3, 40_4, . . . , which are associated with the word memories 11_2, 11_3, . . . , respectively, except the uppermost stage of word memory 11_1. The switches 40_2, 40_3, 40_4, . . . are disposed between the associated word memories 11_2, 11_3, 11_4, . . . and the immediately upwards adjacent word memories 11_1, 11_2, 11_3, . . . , respectively. Among the switches 40_2, 40_3, 40_4, . . . , the switches 40_2, 40_4, 40_6, . . . disposed every other switch turn on in accordance with the first switch control signal on the first control line 41; the switches 40_3, 40_7, . . . disposed every fourth switch, the second switch control signal on the second control line 42; and the switches 40_5, . . . disposed every ninth switch among the remaining switches, the third switch control signal on the third control line 43.

In a case where the number of data constituting a data group is given with 2, supplying the first switch control signal to the first control line 41 causes the switches 40_2, 40_4, 40_6, . . . disposed every other switch to turn on. Thus, there is formed the data line which is broken in every two word memories 11_1, 11_2; 11_3, 11_4; 11_5, 11_6; . . . . In a case where the number of data constituting a data group is given with 4, the first switch control signal is supplied to the first control line 41, and in addition the second switch control signal is supplied to the second control line 42. As a result, there is formed the data line which is broken in every four word memories 11_1, 11_2, 11_3, 11_4; 11_5, 11_6; . . . . Likewise, in a case where the number of data constituting a data group is given with 8, the first switch control signal and the second switch control signal are supplied to the first control line 41 and the second control line 42, respectively, and in addition the third switch control signal is supplied to the third control line 43. As a result, there is formed the data line which is broken in every eight word memories 11_1, . . . , 11_8; 11_9, . . . .

According to the above-described scheme, in a case where the number of data constituting a data group is given with 2N where N=integer, there occurs no idle in the word memory. However, in case of other than 2N, for example, 3, 5, 9, etc., there would occur idle word memories. The constitution, which permits a number of switches 40_2, 40_3, . . . to optionally turn on and off, needs a lot of control lines, and also makes a control circuit for supplying the switch control signals to those control lines complicated. Consequently, the scheme shown in FIG. 7 is inadequate to control optionally a length of the data line.

Figure 8:
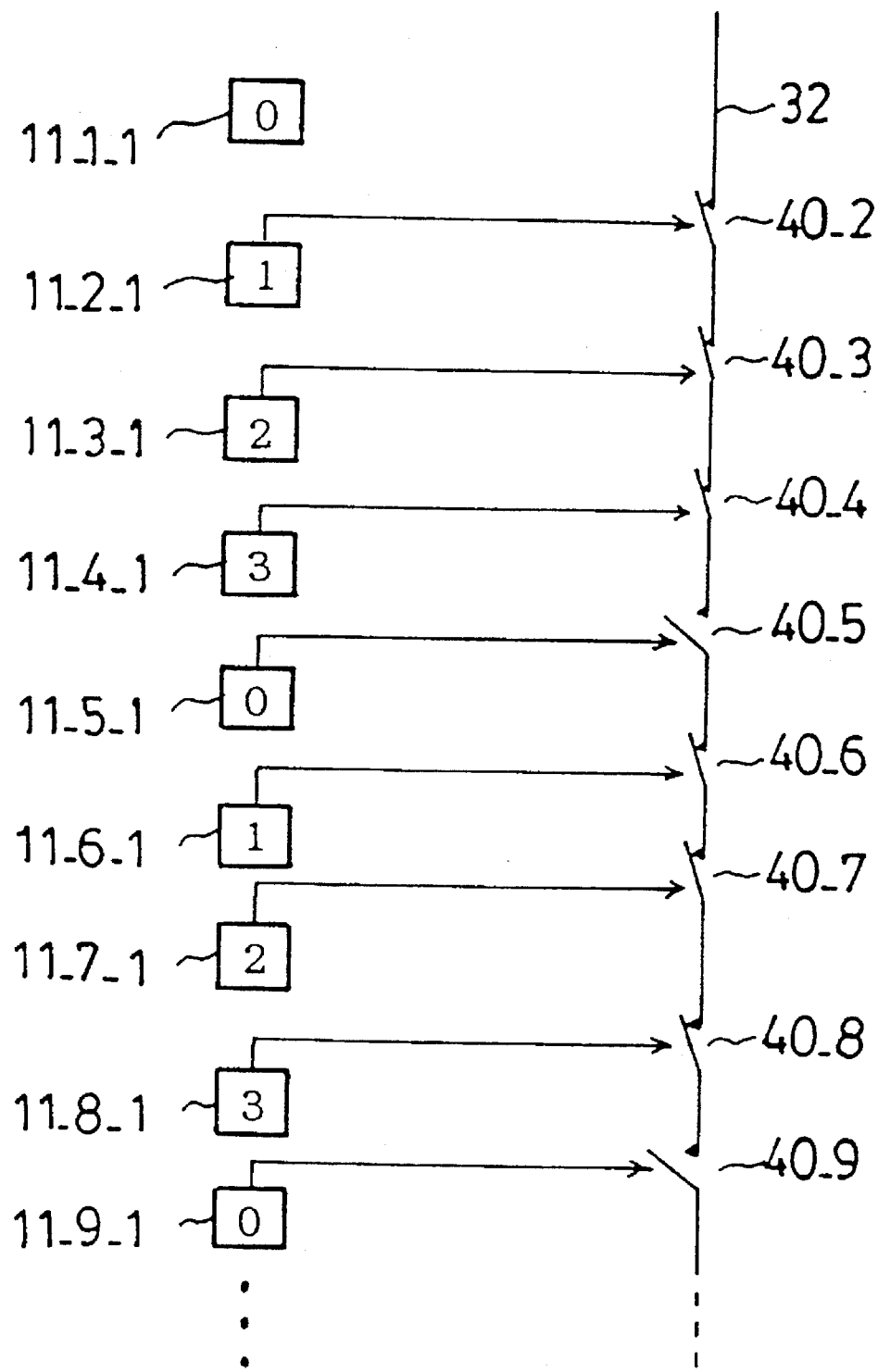
FIG. 8 is a typical illustration showing another scheme of implementing a variable length of data line.

FIG. 8 is a typical illustration showing another scheme of implementing a variable length of data line.

It is the same as the case in FIG. 7 that data line 32 is extended over a plurality of word memories, and on the data line 32 there are arranged in series switches 40_2, 40_3, 40_4, . . . , which are associated with the word memories, respectively, except the uppermost stage of word memory. The word memories are provided with attribute storage units 11_1_1, 11_2_1, 11_3_1, . . . , respectively. In the attribute storage units 11_1_1, 11_2_1, 11_3_1, . . . , there are stored attributes 0, 1, 2 and 3 as shown in the figure, respectively. According to this example, it is so arranged that the switches are controlled in their turn-on or off depending on the attributes 0 or other than 0, that is, 1, 2 and 3 which are stored in the attribute storage units 11_1_1, 11_2_1, 11_3_1, . . . , in such a manner that in case of the attribute 0 the associated switch is kept off, and in case of the attributes 1, 2 or 3 the associated switch is turned on. Such an arrangement makes it possible to form the data line which is broken in every word memories automatically given with an adequate number, independently of the number of data constituting a data group, through disposing attribute 0 of data at the initial of each data group, even if there are mixed data groups each consisting of a different number of data.

Figure 9:
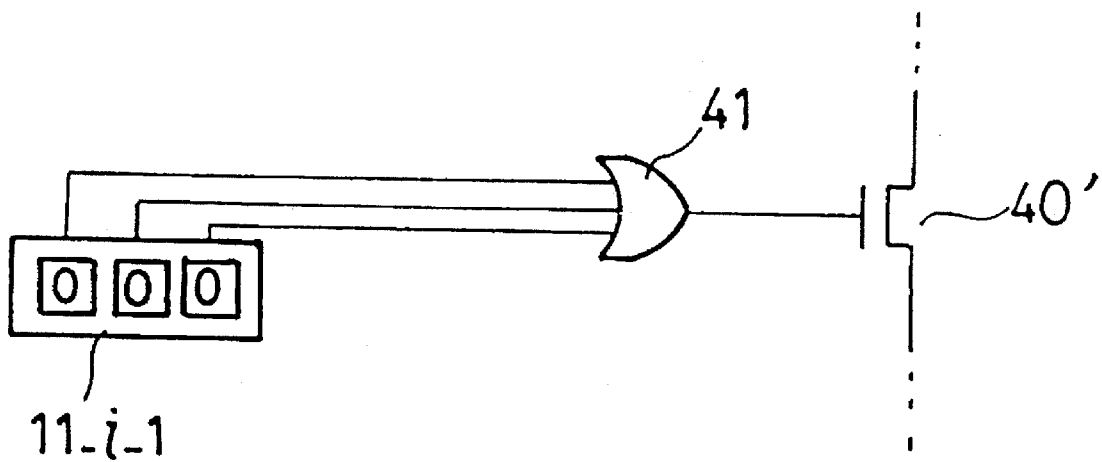
FIG. 9 is a circuit diagram of an attribute determination circuit for determining as to whether or not an attribute is of "0"

FIG. 9 is a circuit diagram of an attribute determination circuit for determining as to whether or not an attribute is of "0".

Here, it is assumed that "000" is assigned to the attribute 0. When an attribute stored in an attribute storage unit 11_i_1 is the attribute 0 ("000"), an OR gate 41 produces a logic "0" signal. Thus, a switch 40' comprising a transistor turns off, so that the data line of the switch 40' is electrically broken in its both sides. When an attribute stored in the attribute storage unit 11_i_1 is other than the attribute 0, the OR gate 41 produces a logic "1" signal. Thus, the switch 40' turns on, so that the data line of the switch 40' is electrically coupled between its both sides.

In this manner, in the embodiment shown in FIG. 6, it is also to adjust a length of each of the data lines 32_1, 32_2, . . . in accordance with the number of data constituting a data group. It is acceptable, of course, to vary or adjust a length of the data line through controlling the switch with the use of control lines for exclusive use or providing additional attribute bits.

Figure 10:
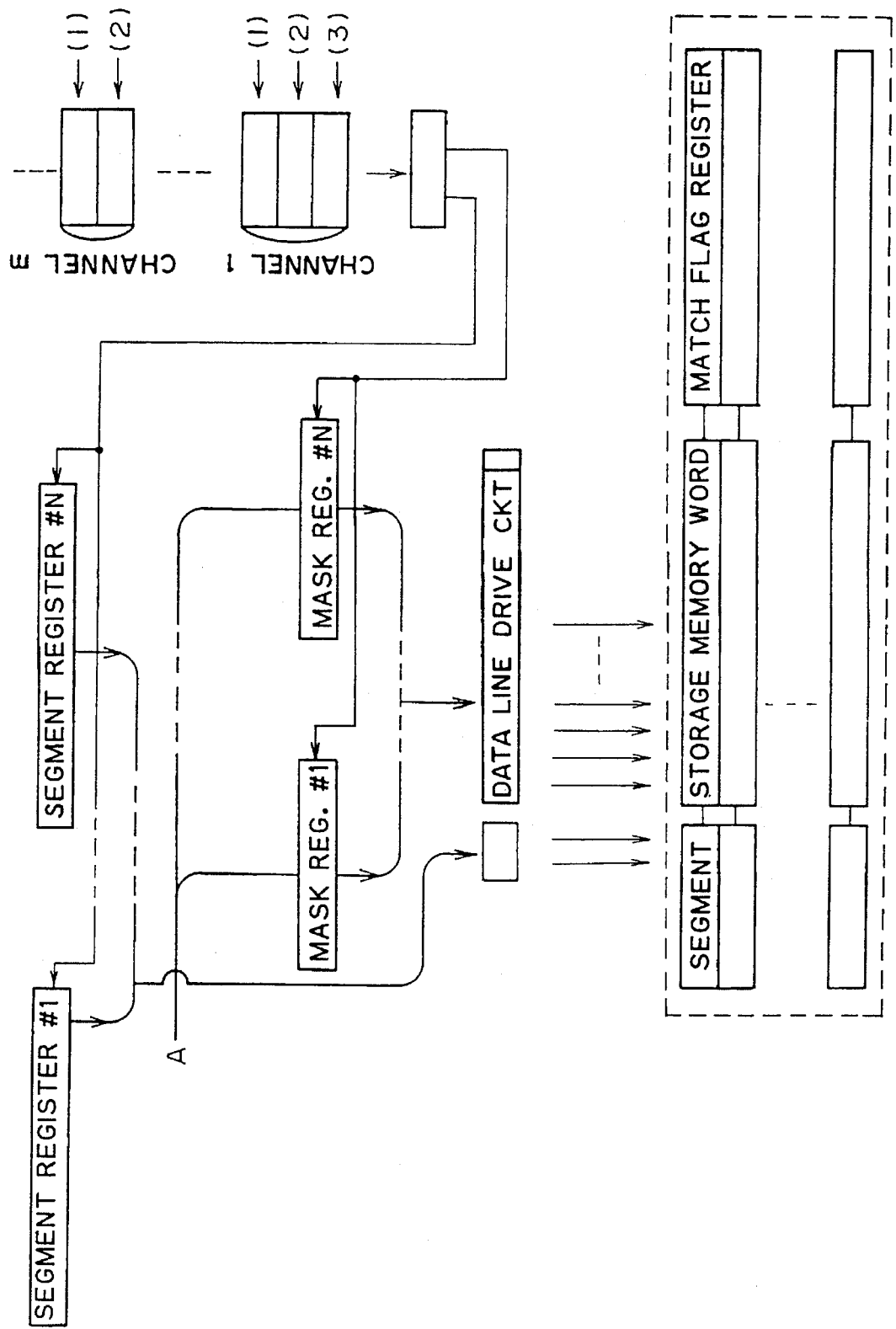
FIG. 10 is a schematic diagram showing a functional structure of the fourth associative memory according to the present invention.
Figure 11:
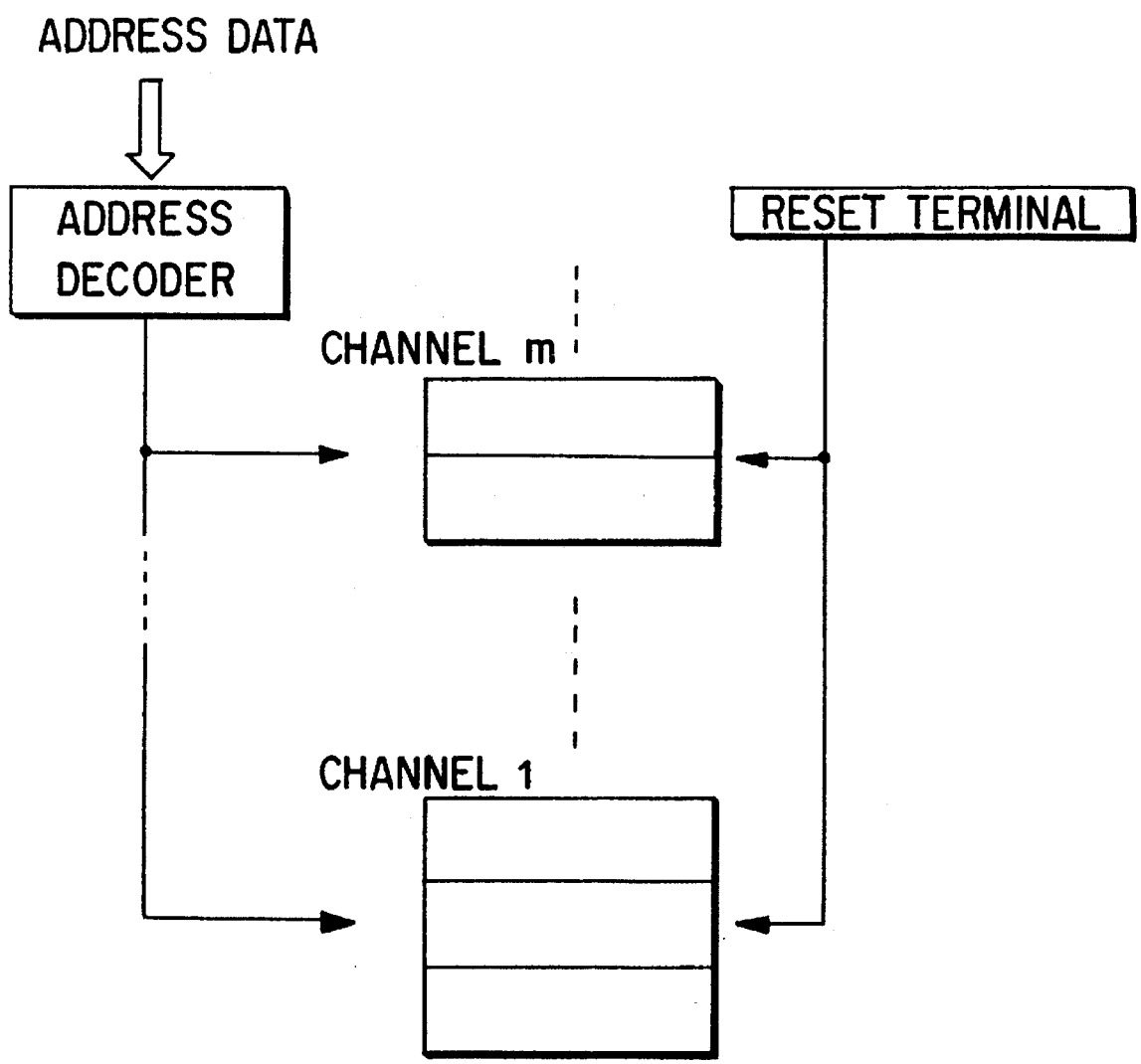
FIG. 11 is a functional block diagram showing a method of designation for control data at the time of retrieval in the fourth associative memory according to the present invention.

FIG. 10 is a schematic diagram showing a functional structure of the fourth associative memory according to the present invention. FIG. 11 is a functional block diagram showing a method of designation for control data at the time of retrieval in the fourth associative memory according to the present invention.

A number of word memories, constituting the associative memory, each store both segment data corresponding to the above-mentioned attribute data and usual data. The associative memory is provided with N pieces of segment register which is an example of a retrieval auxiliary data register referring to the present invention, and in addition N pieces of mask register which is another example of the retrieval auxiliary data register referring to the present invention.

When segment data or mask data is written into any of the segment registers or any of the mask registers, data A to be written is inputted and in addition an intended register is designated with function data FUN_DATA, and then a WRITE signal is inputted. Thus, the desired data A may be written into a desired register.

The associative memory is also provided with a plurality of channels (control register groups) each comprising a plurality of control data registers each for storing control data to designate any of the segment registers and any of the mask registers at the time of retrieval.

A writing of the control data into the control data register is performed in such a manner that data A to be written is inputted and in addition an intended channel is designated, and then a WRITE signal is inputted. In this manner, the data A is stored, as the control data, in youngest number of control data register among the non working control data registers within the designated channel. For example, after initialization, if channel 1 is first designated, the control data is stored in the control data register of (1) of channel 1. And, if channel 1 is designated at the second time, the control data is stored in the control data register of (2) of channel 1.

Whereas, to perform the retrieval, as shown in FIG. 11, address data representative of channel 1 is applied, and in addition a desired data A is inputted as the first reference data in synchronism with a WRITE signal instructing the retrieval. At that time, assuming that all of the channels have been reset by a reset signal received by a reset terminal, when the control data stored in the control data register of (1) of channel 1 designated by the address is to designate, for example, a segment register #2 among the N pieces of segment register and to designate, for example, a mask register #3 among the N pieces of mask register, the entered data A is masked in accordance with mask data stored in the mask register #3. Thus, a match comparison is performed between reference data consisting of both the produced masked data and the segment data stored in the segment register #2, and storage data stored in the respective word memories.

Next, when the same address data as the previous one (address data designating channel 1) is inputted as address data, and in addition new data B as reference data is inputted to instruct the retrieval, one of the N pieces of segment register and one of the N pieces of mask register are designated in accordance with the control data stored in the control data register of (2) of channel 1. When the control data stored in the control data register of (2) of channel 1 is to designate, for example, a segment register #1 and a mask register #1, the entered data B is masked in accordance with mask data stored in the mask register #1. Thus, a match comparison is performed between reference data consisting of both the produced masked data and the segment data stored in the segment register #1, and storage data stored in the respective word memories.

In the manner as mentioned above, according to the associative memory shown in FIGS. 10 and 11, there are stored beforehand in the respective channels plural control data each for designating the segment register and the mask register, or directly stored the segment data and the mask data, that is, retrieval modes being stored in the respective channels, and to perform a retrieval a channel is designated, so that there is performed a retrieval according to the retrieval mode stored in the designated channel. According to the associative memory shown in FIGS. 10 and 11, there in no need to apply the segment data and the mask data from the exterior every retrieval, and it is possible to perform a series of plural number of times of retrieval only through inputting sequentially address data representative of a retrieval mode (retrieval channel) and reference data, thereby simplifying the retrieval procedure and providing a series of high speed retrieval.

Specifically, regarding the retrieval of data forming a group structure, the associative memory according to the present invention is used to store retrieval data, and regarding a series of plural number of times of retrieval, a programmable sequence register is used to store beforehand retrieval auxiliary data in the order of use. This permits the retrieval auxiliary data to be automatically sequentially selected through sequentially inputting only reference data from the exterior. In the present embodiment, there is described the constitution of the sequence register in two ways referring to FIGS. 10, 11 and 13 (described later).

Further, according to the associative memory shown in FIGS. 10 and 11, it is possible to simultaneously store m retrieval modes and it is permitted to rewrite the retrieval modes. Therefore, it is possible to implement an associative memory having a large degree of freedom.

Figure 12:
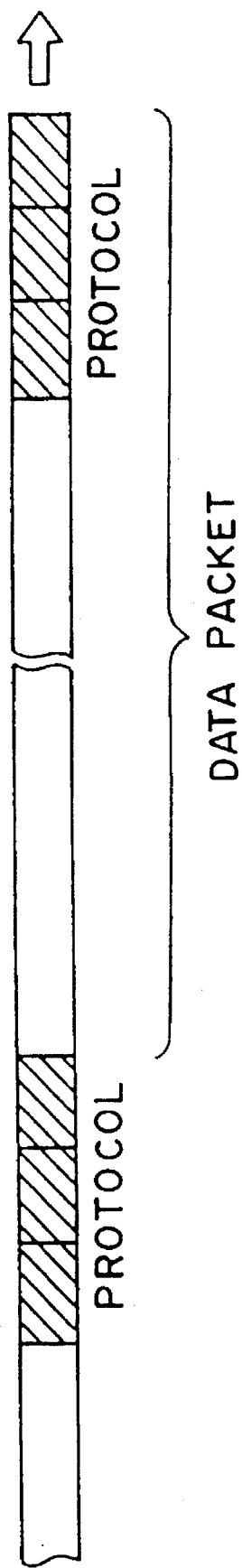
FIG. 12 is an illustration showing a data structure of data to be treated in an associative memory by way of example.

FIG. 12 is an illustration showing a data structure data to be treated in an associative memory as shown in FIGS. 10 and 11 by way of example.

As illustrated in the figure, it is assumed that for example, m bits of parallel data are entered sequentially in the direction indicated by the arrow. The set of a series of data is referred to as a data packet. The head of each data packet is provided with a protocol which indicates procedure of a data communication and the like. It is assumed that the present associative memory performs the data retrieval on a portion of the protocol. At the time point of termination of the data retrieval on the portion of the protocol concerning some data packet, a channel (e.g., channel 1; FIGS. 10 and 11) used for such data retrieval is in a state that the last control data register of the channel 1 has been designated. Consequently, prior to execution of the subsequent retrieval using the channel 1, it is necessary to make a reset so that the first control data register of the channel 1 can be designated. In case of dealing data shown in FIG. 12, however, if a reset is automatically made at the time point of termination of the data retrieval on the portion of the protocol concerning some data packet, the retrieval operation would be carried out up to the portions subsequent to the protocol of the data packet. In view of this, as shown in FIG. 11, it is so arranged that a reset signal is applied from the exterior, so that a reset is made at the time point of termination of the data packet or initiation of the subsequent data packet. Thus, it is possible to avoid such inconvenience as mentioned above.

According to the embodiment as described above, while it is so arranged that both the segment register and the mask register are designated on the basis of the control data, it is acceptable to arrange in such a manner that only the segment register or mask register is designated. Further, it is acceptable to provide, as a retrieval auxiliary register, an additional register for storing retrieval auxiliary data other than the segment data and the mask data.

Figure 13:
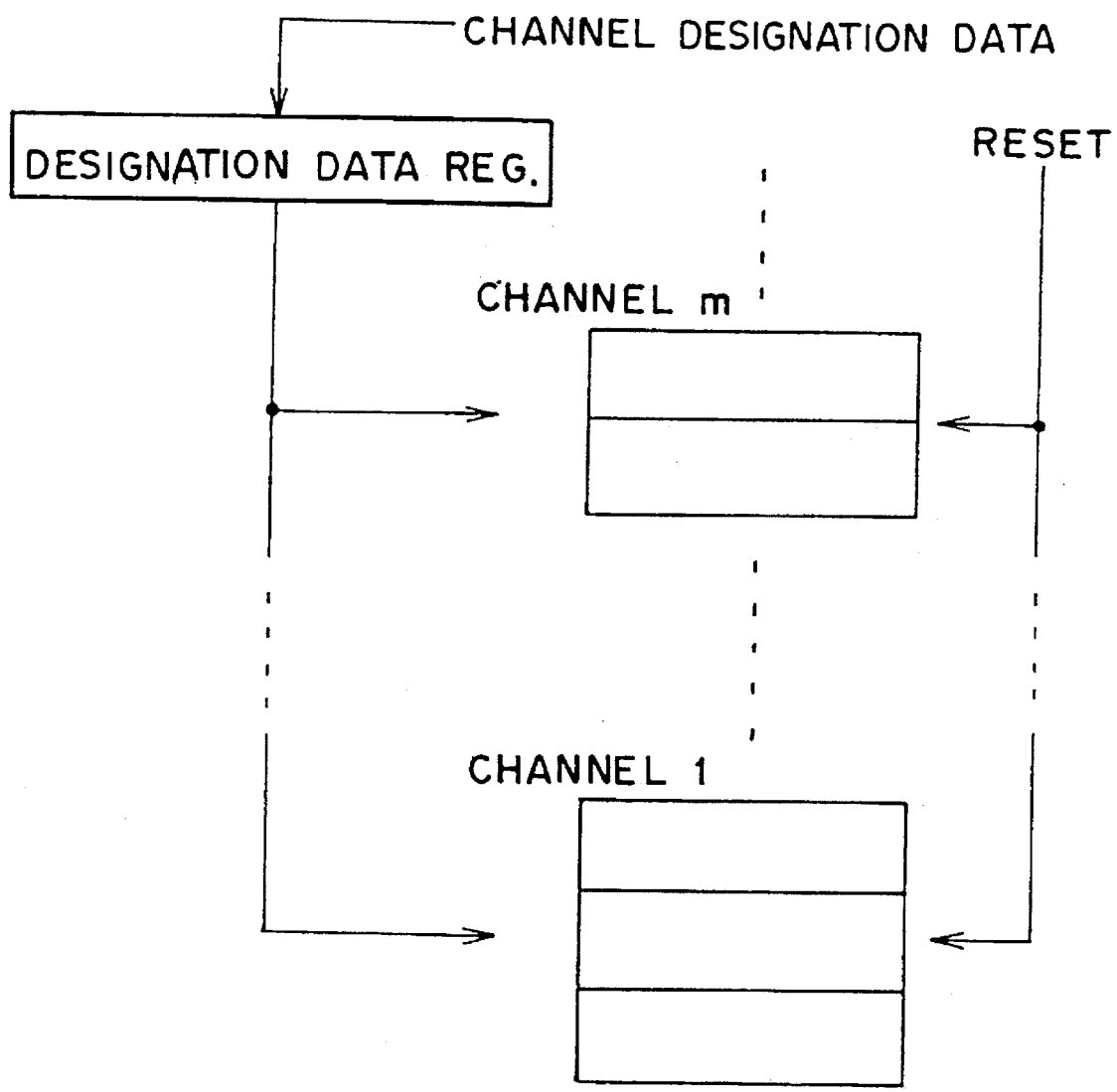
FIG. 13 is a functional block diagram of part corresponding to FIG. 11, showing the difference of the fifth associative memory of the present invention from the fourth associative memory shown in FIGS. 10 and 11.

FIG. 13 is a functional block diagram of part corresponding to FIG. 11, showing the difference of the fifth associative memory of the present invention from the fourth associative memory shown in FIGS. 10 and 11.

The associative memory shown in FIG. 13 is provided with a designation data register for storing channel designation data to designate any one of a plurality of channels.

Hence, in retrieval, it is sufficient to once store the channel designation data in the designation data register. Thereafter, simple sequential application of only the reference data permits a series of retrieval to be performed. Thus, it is possible to more simplify the procedure for retrieval comparing with the associative memory shown in FIGS. 10 and 11.

It is, of course, acceptable that the above-mentioned channel designation is implemented with the use of control terminals for exclusive use, instead of the register and the addressing, or taking in their combination.

Further, it is noted that the retrieval simplifying means by these programmable sequence registers plays an important role in flexible and high speed retrieval for group data according to the present invention.

The present invention is not limited to the particular embodiments described above. Various changes and modifications may be made within the spirit and scope of the invention.

I claim:

1. An associative memory having a plurality of arranged word memories each storing digital data, in which reference data is applied to retrieve the word memory or memories storing digital data having a bit pattern which coincides with a bit pattern of a whole or a predetermined part of the applied reference data, wherein said each word memory has a first area storing the associated digital data, and a second area storing attribute data representative of an attribute of the digital data stored in the first area, said attribute data having a bit pattern which repeats on a circulative basis at a period according to a number of attributes in the order of address of said each word memory.

2. An associative memory according to claim 1, wherein said each word memory stores fixedly on a second area thereof the attribute data having a bit pattern which repeats on a circulative basis at a period according to a number of attributes in the order of address of said each word memory.

3. An associative memory having a plurality of arranged word memories each storing digital data, in which reference data is applied to retrieve the word memory or memories storing digital data having a bit pattern which coincides with a bit pattern of a whole or a predetermined part of the applied reference data, wherein said associative memory has a retrieval address range set circuit for setting an address range of the word memory as an object of match comparison with the applied reference data, among the whole range of addresses assigned to the plurality of arranged word memories, respectively.

4. An associative memory having a plurality of word memories each for storing storage data, and retrieval auxiliary data sequential output means for sequentially outputting retrieval auxiliary data to issue reference data to be compared with the associated storage data by means of coupling with sequentially applied reference data, wherein retrieval for word memories storing a predetermined storage data is performed.

5. An associative memory according to claim 4, wherein said retrieval auxiliary data sequential output means comprises:

a retrieval auxiliary data register group for storing a series of retrieval auxiliary data; and control means for designating and controlling said retrieval auxiliary data register group, said control means being defined in an address and arranged to receive address data representative of said address along with said reference data, wherein said control means, which is designated by said address data, controls on the basis of the received address data along with said reference data and a number of times of said retrieval as well said retrieval auxiliary data register group to sequentially output the retrieval auxiliary data.

6. An associative memory according to claim 4, wherein said retrieval auxiliary data sequential output means comprises:

a retrieval auxiliary data register group for storing a series of retrieval auxiliary data;

control means for designating and controlling said retrieval auxiliary data register group; and a channel designation data register for storing channel designation data to designate said control means, wherein the retrieval auxiliary data are sequentially outputted on the basis of said control means designated by the channel designation data stored in said channel designation data register and a number of times of said retrieval through inputting the reference data.

7. An associative memory according to claim 4, having a reset terminal arranged to receive a sequence reset signal to initialize an output sequence of the retrieval auxiliary data of said retrieval auxiliary data sequential output means.

* * * * *